US011430787B2

(12) United States Patent
Jambunathan et al.

(10) Patent No.: US 11,430,787 B2
(45) Date of Patent: Aug. 30, 2022

(54) FORMING CRYSTALLINE SOURCE/DRAIN CONTACTS ON SEMICONDUCTOR DEVICES

(71) Applicant: Intel Corporation, Santa Clara, CA (US)

(72) Inventors: Karthik Jambunathan, Hillsboro, OR (US); Scott J. Maddox, Hillsboro, OR (US); Cory C. Bomberger, Portland, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/639,024

(22) PCT Filed: Sep. 26, 2017

(86) PCT No.: PCT/US2017/053410
§ 371 (c)(1),
(2) Date: Feb. 13, 2020

(87) PCT Pub. No.: WO2019/066772
PCT Pub. Date: Apr. 4, 2019

(65) Prior Publication Data
US 2020/0365585 A1 Nov. 19, 2020

(51) Int. Cl.
H01L 27/08 (2006.01)
H01L 27/088 (2006.01)
(Continued)

(52) U.S. Cl.
CPC .... H01L 27/0886 (2013.01); H01L 29/41791 (2013.01); H01L 29/66795 (2013.01); H01L 21/28518 (2013.01)

(58) Field of Classification Search
CPC .......... H01L 27/0886; H01L 29/41791; H01L 29/66795; H01L 21/28518
See application file for complete search history.

(56) References Cited

U.S. PATENT DOCUMENTS 9,312,173 B2 * 4/2016 Cheng .................. H01L 29/456
9,893,189 B2 * 2/2018 Colinge ............ H01L 29/66636
(Continued)

FOREIGN PATENT DOCUMENTS

WO 2014133293 A1 9/2014
WO 2015094244 A1 6/2015
WO 2019066772 A1 4/2019

OTHER PUBLICATIONS

PCT International Preliminary Report on Patentability for Appl No. PCT/US2017/053410 dated Mar. 31, 2020, 10 pages.
(Continued)

Primary Examiner — Fernando L Toledo
Assistant Examiner — Valerie N Newton
(74) Attorney, Agent, or Firm — Schwabe, Williamson & Wyatt, P.C.

(57) ABSTRACT

Techniques for forming contacts comprising at least one crystal on source and drain (S/D) regions of semiconductor devices are described. Crystalline S/D contacts can be formed so as to conform to some or all of the top and side surfaces of the S/D regions. Crystalline S/D contacts of the present disclosure are formed by selectively depositing precursor on an exposed portion of one or more S/D regions. The precursor are then reacted in situ on the exposed portion of the S/D region. This reaction forms the conductive, crystalline S/D contact that conforms to the surface of the S/D regions.

20 Claims, 12 Drawing Sheets

(51) Int. Cl.
*H01L 29/417* (2006.01)
*H01L 29/66* (2006.01)
*H01L 21/285* (2006.01)

(56) References Cited

U.S. PATENT DOCUMENTS

| | | |
|---|---|---|
| 2015/0380502 A1 | 12/2015 | Yu et al. |
| 2016/0126343 A1 | 5/2016 | Ching et al. |
| 2016/0148936 A1 | 5/2016 | Xu |
| 2017/0162671 A1 | 6/2017 | Basker |
| 2017/0186624 A1 | 6/2017 | Woodruff |
| 2017/0186775 A1 | 6/2017 | Balakrishnan |
| 2017/0194442 A1 | 7/2017 | Yeo |

OTHER PUBLICATIONS

PCT International Search Report for Appl No. PCT/US2017/053410 dated Jun. 26, 2018, 3 pages.
PCT International Written Opinion for Appl No. PCT/US2017/053410 dated Jun. 26, 2018, 9 pages.
Office action for Taiwan Patent Application No. 107125843 dated Dec. 2, 2021, 22 pages.

\* cited by examiner

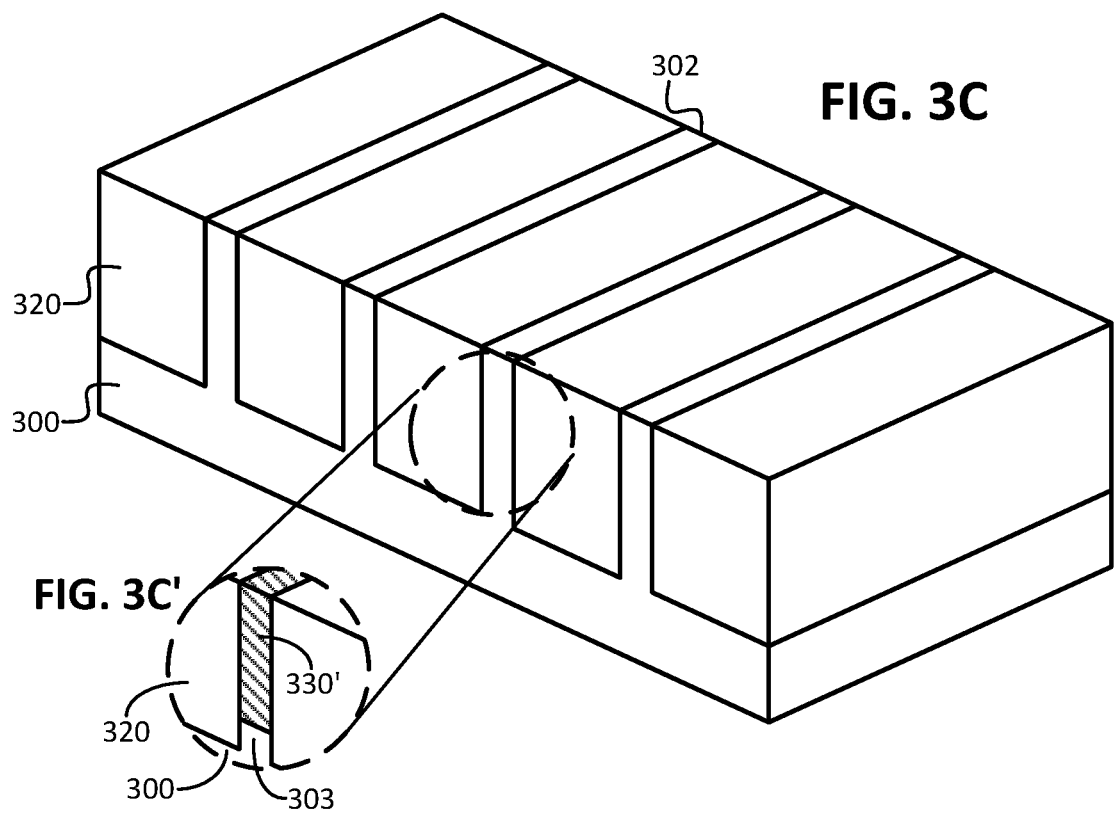
FIG. 3C
FIG. 3C'
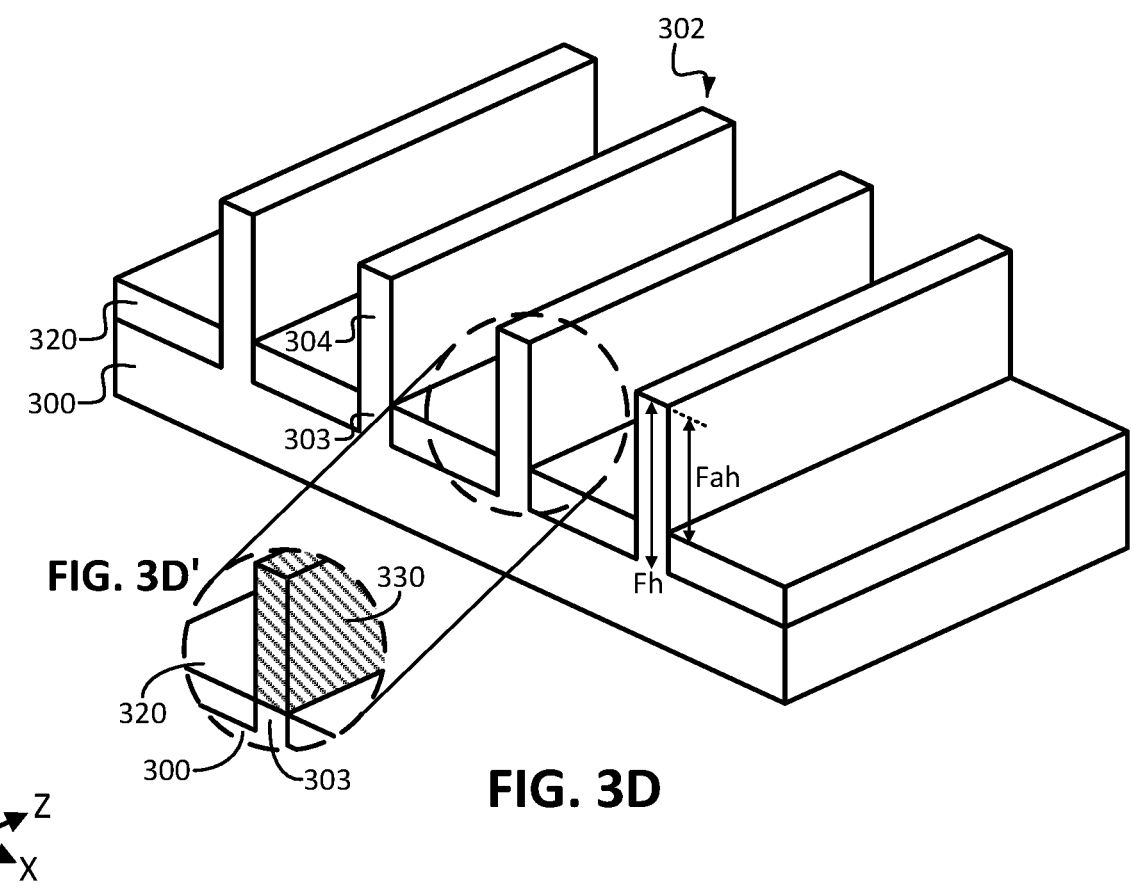
FIG. 3D'
FIG. 3D

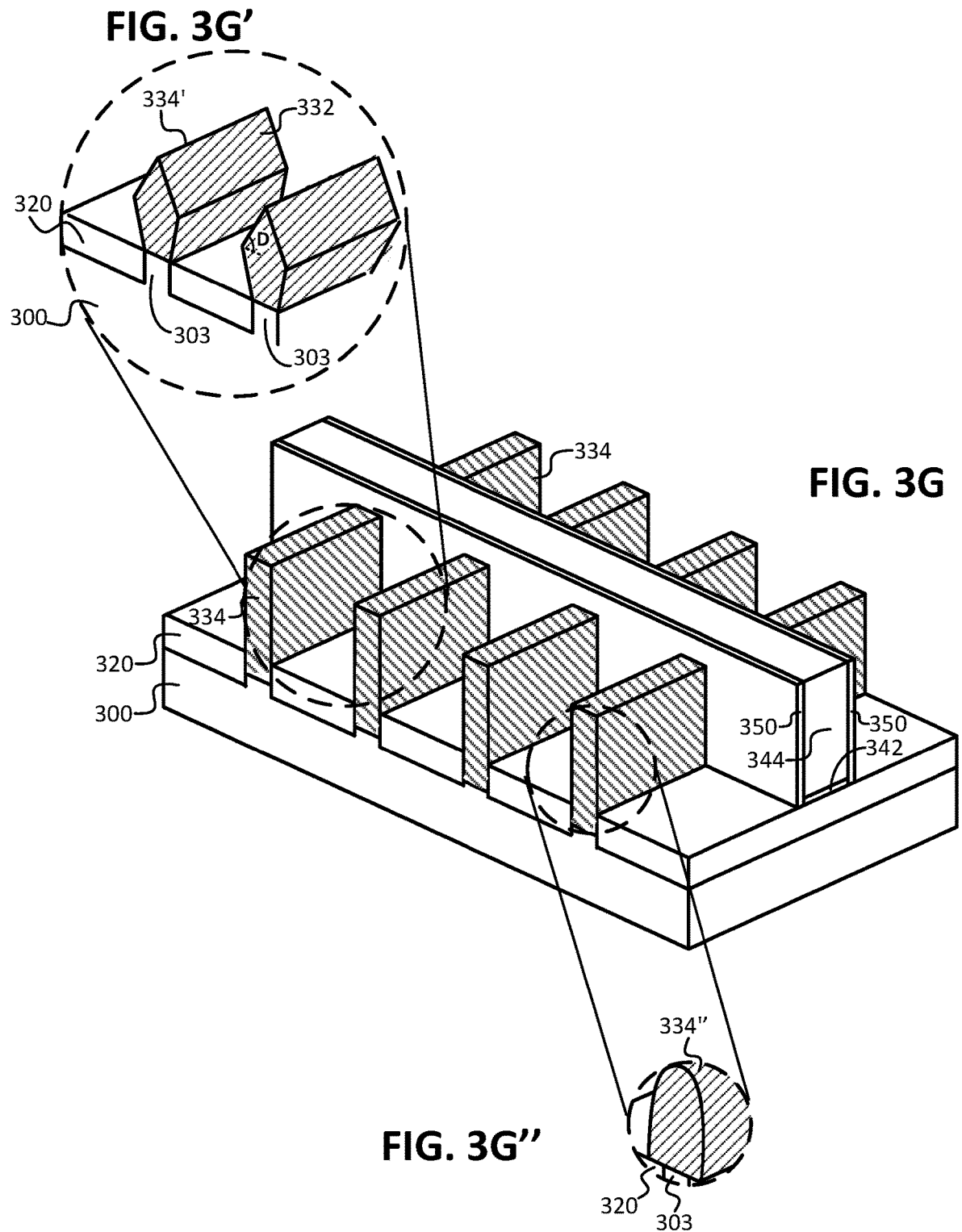

FORMING CRYSTALLINE SOURCE/DRAIN CONTACTS ON SEMICONDUCTOR DEVICES

CROSS-REFERENCE TO RELATED APPLICATIONS

This patent application is a U.S. National Phase Application under 35 U.S.C. § 371 of International Application No. PCT/US2017/053410, filed on Sep. 26, 2017, the entire contents of which is hereby incorporated by reference herein.

BACKGROUND

Semiconductor devices are electronic components that exploit the electronic properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Standard dopants used for Si, Ge, and SiGe includes boron (B) for p-type (acceptor) dopant and phosphorous (P) or arsenic (As) for n-type (donor) dopant. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (p-MOS) and n-channel MOSFET (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin).

BRIEF DESCRIPTION OF THE DRAWINGS

FIGS. 3A-3K are schematic perspective views of a FinFET semiconductor device at various stages of the example method flow diagrams of FIGS. 1 and 2, in accordance with an embodiment of the present disclosure.

Figure 1:
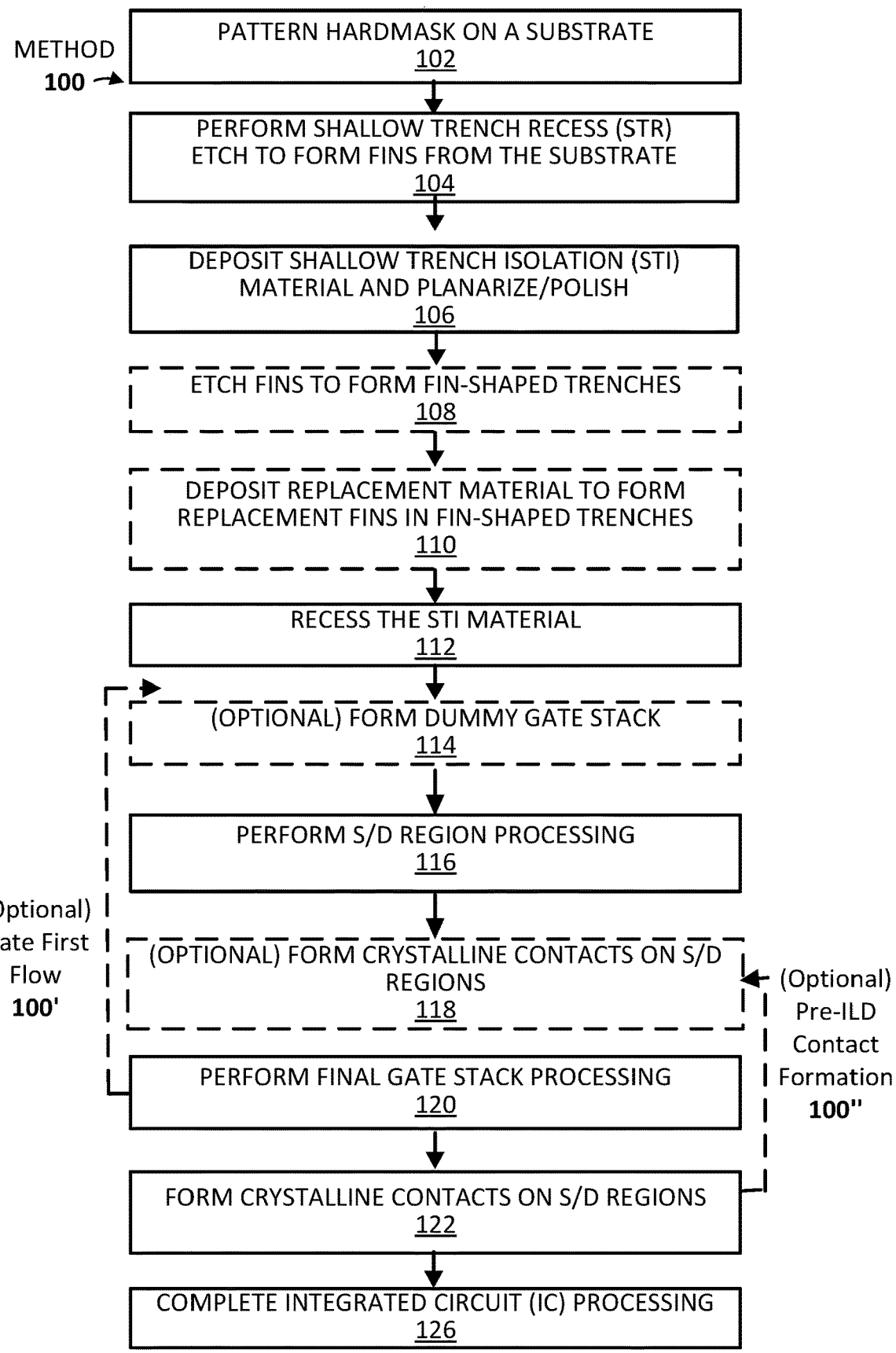
FIG. 1 is a method flow diagram depicting an example method for fabricating a FinFET semiconductor device that includes source and drain region contacts comprised of at least one crystal, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

Techniques are disclosed for forming contacts comprising at least one crystal on source and drain (S/D) regions of semiconductor devices. S/D region contacts of at least one crystal ("crystalline S/D contacts" for brevity) can be formed on at least a portion of a top surface of corresponding S/D regions. In some embodiments, crystalline S/D contacts can be formed so as to conform to some or all of the top and side surfaces of the S/D regions. The greater the extent of coverage of a S/D region by a crystalline contact, the lower the contact resistance between the contact and its corresponding source or drain region, and thus the better the performance of the semiconductor device, according to some embodiments. Crystalline S/D contacts of the present disclosure are formed, for example, by selectively depositing precursors on an exposed portion of one or more S/D regions. The precursors are then reacted with each other in situ on the exposed portion of the S/D region. This reaction forms the conductive, crystalline S/D contact that conforms to the surface of the S/D regions. The dimensions of the crystalline S/D contacts of the present disclosure can vary from one embodiment to the next, but in some cases the crystalline S/D contacts have (vertical) thicknesses of 5 nm to 30 nm (e.g., 20 nm or less). Furthermore, because crystalline S/D contacts can be formed by depositing precursors that can be deposited uniformly, unlike sputtered elemental metals, the variation in thickness between S/D contacts across a plurality of S/D regions and integrated circuit devices on a substrate can be relatively low (e.g., 5 nm or less, at most 3 nm, at most 2 nm, at most 1 nm, or 0.9 nm or less). Furthermore, because of the convenience with which precursors are deposited, S/D contacts can be formed with relatively low thickness and low variability as indicated above even for integrated circuit devices in which a pitch between adjacent source regions and drain regions is 100 nm or less. Integrated circuit devices produced according to embodiments of the present disclosure may thus exhibit higher manufacturing yields and better device performance because of the more uniform contacts having a lower contact resistance compared to devices prepared by deposition of amorphous elemental metals as a contact material.

General Overview

An important feature of integrated circuit device performance is the electrical contact resistance between source and drain (S/D) regions and the corresponding S/D contacts. High contact resistance between a S/D region and a corresponding contact degrades transistor performance by converting electrical current to waste heat, and slowing the flow of current through the transistor. S/D contacts are often formed by non-selectively depositing an amorphous blanket layer of an elemental metal (e.g., by sputtering, also known as physical vapor deposition or PVD) across a substrate comprising a plurality of S/D regions. Elemental metals often selected for this blanket deposition are titanium (Ti), nickel (Ni), and cobalt (Co), platinum (Pt), erbium (Er), among others. The blanket layer is then photolithographically patterned by masking and etching so that most of the blanket layer can be removed. The portions of the blanket metal layer that remain after etching generally correspond to the S/D region contacts. Heat is then applied to the portions of the blanket metal layer remaining on the S/D regions, thus reacting the elemental metal with the material of the S/D regions to form a conductive metal silicide (in the case of S/D regions comprising silicon and optionally a dopant) and/or a conductive metal germanide (in the case of S/D regions comprising germanium and optionally a dopant). The resulting silicide and germanide thus forms amorphous S/D contacts.

Blanket deposition of an elemental metal poses a number of challenges to fabricating uniform S/D contacts with a low contact resistance. First, it can be challenging to control film thickness when depositing material by sputtering. When sputtering the blanket metal layer, the thickness can vary between the various S/D regions on a substrate by values far greater than 5 nm, and in some cases greater than 10 nm or 20 nm. This variation in thickness can, in turn, lead to variations in the thickness and electrical resistance of the silicide or germanide contact. Variations in contact layer thickness (and thus variations in resistance) can cause timing delays between the operation of transistors for which coordinated operation would be beneficial. Second, because the fraction of surface area of a substrate occupied by S/D regions is relatively low, removing most of the blanket layer of elemental metal can be challenging. Portions of the blanket layer of elemental metal not on a S/D region that are inadvertently not removed can form electrical short circuits between transistors within an integrated circuit device. These can sometimes be detected as a fault during testing, which results in the removal of the integrated circuit device. This outcome is often referred to as "yield loss." Other times, these residual portions of improperly placed metal only form an electrical short after use in a device, thus degrading reliability of the integrated circuit device. This risk of incompletely removed blanket metal and improperly placed residual metal increases as dimensions of transistor devices shrink, and more specifically as a minimum pitch between adjacent S/D regions and/or adjacent gate regions of adjacent transistors shrink to 100 nm or less.

Furthermore, the high temperature processes used to react the elemental metal with the silicon (and/or silicon germanium) of the S/D regions to form the contacts can produce several undesirable side effects. For example, the high temperature processes can cause diffusion of dopants from the S/D regions (and more specifically, from the portions of the S/D regions adjacent to the contact) into the contact material. In some cases, dopant (e.g., phosphorous for n-type S/D regions and boron for p-type S/D regions) can diffuse more than 10 nm or more than 20 nm into the contact. This has the effect of reducing dopant concentration in the S/D, thus increasing the contact resistivity and degrading the performance of the device. Second, even though the high temperature processes are intended to react the elemental metal with the material of the S/D to form the contact, this is a diffusion-limited, solid state reaction and thus can be incomplete. In some cases, this incomplete reaction can result in the formation of titanium silicide (TiSi) instead of the lower resistance titanium disilicide (TiSi$_2$) that is intended to be produced by the reaction. The result of these effects is a contact resistivity of greater than $2\times10^{-9}$ Ohm-cm.

Thus, techniques are described herein for forming crystalline S/D contacts. In an embodiment, the techniques include selectively depositing precursors on at least a portion of the source and drain regions of an integrated circuit device. This selective deposition is enabled by the energetic preference for the precursors for crystalline surfaces relative to amorphous surfaces (e.g., ILD). This conveniently reduces the surface area on which the precursors are deposited compared to the blanket elemental metal layer described above. The precursors are provided on the S/D regions using, for example, chemical vapor deposition (CVD), metalorganic chemical vapor deposition (MOCVD), atomic layer deposition (ALD), and molecular beam epitaxy (MBE), among others. Depending on the portions of S/D regions left exposed, S/D contacts can even encapsulate an exposed portion of a S/D region from the top surface of the S/D region to a bottom surface of the S/D region that is proximate to an underlying substrate or fin stub. Once the precursors are selectively deposited on crystalline S/D surfaces, they are reacted with each other (and not the material of the S/D regions) in situ on the portions of the S/D regions on which they are disposed to form conductive, conformal, metallic silicides and/or germanides of at least one crystal. This process omits the blanket elemental metal deposition, extensive etch, and complicated thermal processing used to form S/D contacts, as described above.

One benefit of forming S/D contacts according to some embodiments of the present disclosure includes decreased contact resistance between a S/D semiconductor region and its corresponding conformal, crystalline contact because of increased interfacial area and increased crystallinity relative to a contact formed from an amorphous blanket layer of metal. This decreased contact resistance can in turn improve performance of the integrated circuit device by increasing transistor switching speed and reducing power consumption. Another benefit of some embodiments described herein includes the reduction of improperly placed metal that can cause electrical shorts, as described above. Another benefit of some embodiments of the present disclosure includes improved uniformity of S/D contact thickness, with variation between S/D contact thicknesses varying at most 5 nm (and in some embodiments, at most 3 nm, or at most 2 nm, or at most 1 nm, such as 0.9 nm or less in thickness variation) across a substrate that may contain thousands, tens of thousands, or millions of S/D regions. This also can improve integrated circuit device performance by reducing contact resistance variability of integrated circuit devices across a substrate.

Fabrication Techniques

Figure 2:
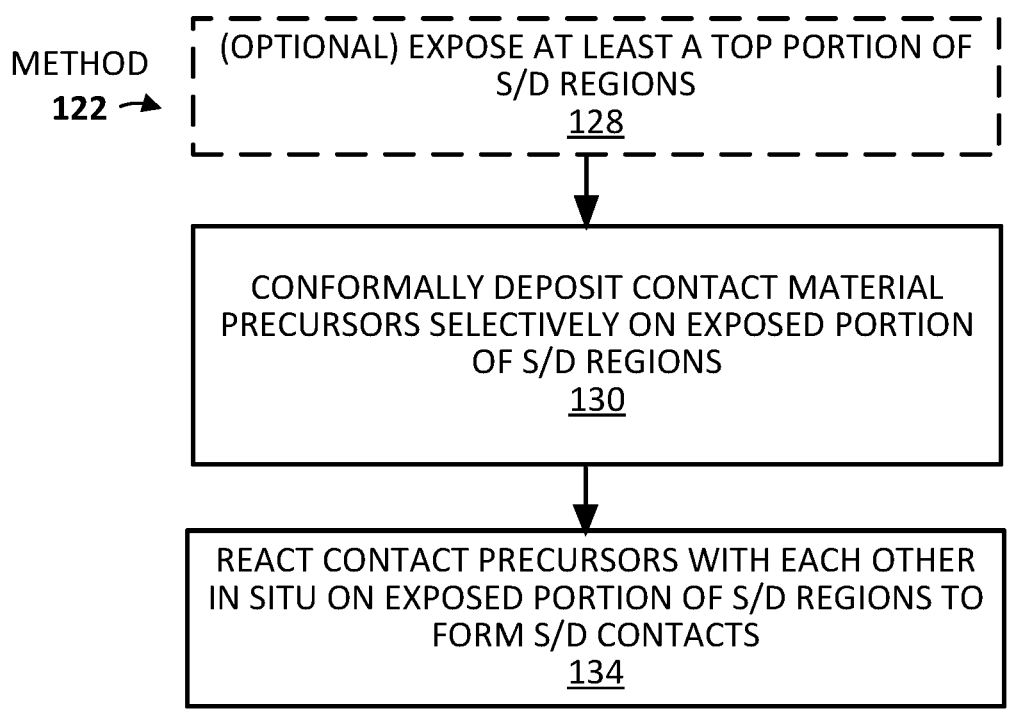
FIG. 2 is a method flow diagram depicting an example method for fabricating source and drain region contacts comprised of at least one crystal on corresponding source and drain regions, in accordance with an embodiment of the present disclosure.

FIG. 1 and FIG. 2 illustrate methods 100 and 122, respectively, of forming an integrated circuit (IC) including one or more transistors comprising crystalline source and drain contacts, in accordance with embodiments of the present disclosure. FIGS. 3A-3K and FIGS. 4A-4D illustrate example IC structures that are formed when performing the methods 100 and 200 of FIGS. 1 and 2, in accordance with some embodiments. The structures of FIGS. 3A-3K are primarily depicted and described herein in the context of forming finned or FinFET transistor configurations (e.g., tri-gate transistor configurations), for ease of illustration. However, in some embodiments, the techniques can be used to form transistors of any suitable geometry or configuration, as can be understood based on this disclosure. For example, FIG. 3J illustrates an example IC structure including transistors with nanowire configurations, as will be described in more detail below. Also note that the techniques and structures are primarily depicted and described in the context of forming metal-oxide-semiconductor field-effect transistors (MOSFETs). However, the present disclosure is not intended to be so limited unless stated otherwise. Further note that method 100 includes a primary path that illustrates a gate last transistor fabrication process flow, in accordance with some embodiments. However, in other embodiments, a gate first process flow may be used, as will be described herein (and which is illustrated with the alternative gate first flow 100' indicator in FIG. 1). Numerous variations and configurations will be apparent in light of this disclosure.

A multitude of different transistors and transistor-based devices can benefit from the techniques described herein, which may include, but are not limited to, field-effect transistors (FETs), metal-oxide-semiconductor FETs (MOSFETs), tunnel FETs (TFETs), and Fermi filter FETs (FFFETs), to name a few examples. For example, the techniques may be used to benefit either or both of the S/D regions of an n-channel MOSFET (n-MOS) device, which may include a source-channel-drain doping scheme of n-p-n or n-i-n, where 'n' indicates n-type doped semiconductor material, 'p' indicates p-type doped semiconductor material, and T indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to benefit either or both of the S/D regions of a p-channel MOSFET (p-MOS) device, which may include a source-channel-drain doping scheme of p-n-p or p-i-p, in accordance with some embodiments. In yet another example, the techniques may be used to benefit either or both of the S/D regions of a TFET device, which may include a source-channel-drain doping scheme of p-i-n or n-i-p, in accordance with some embodiments. In still another example, the techniques may be used to benefit one or both of the S/D regions of a FFFET device, which may include a source-channel-drain doping scheme of np-i-p (or np-n-p) or pn-i-n (or pn-p-n), in accordance with some embodiments. Further, the techniques may be used to benefit complementary transistor circuits, such as CMOS circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Figure 3A:
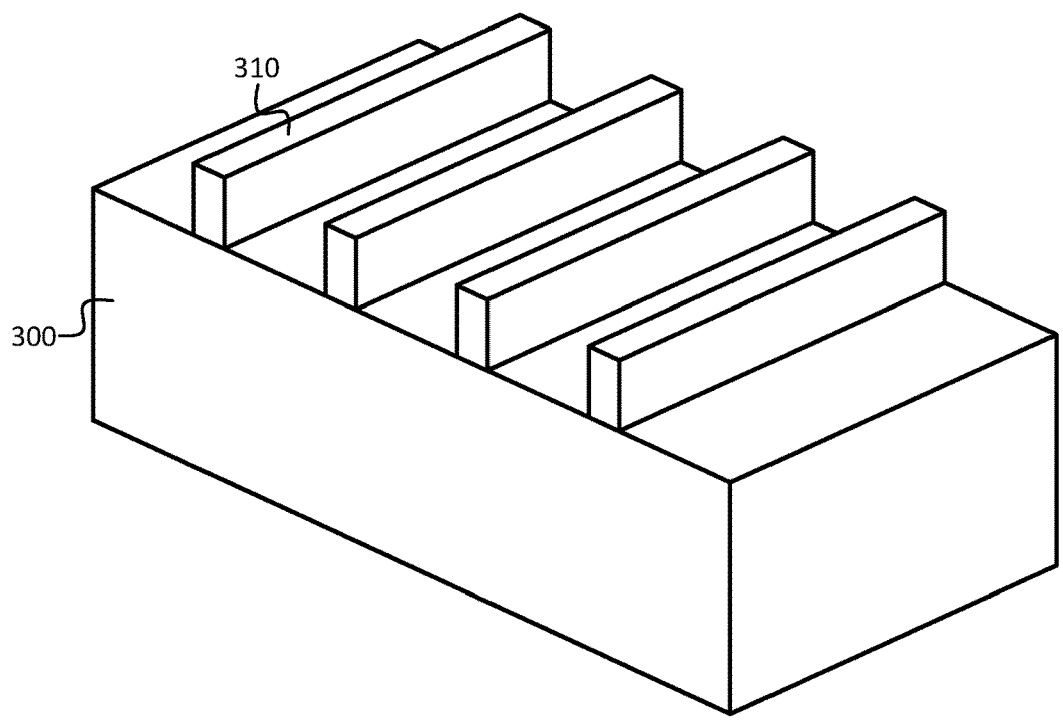

Method 100 of FIG. 1 includes patterning 102 hardmask on a substrate, such as patterning hardmask 310 on substrate 300 to form the example structure of FIG. 3A, in accordance with some embodiments. In some embodiments, hardmask 310 may be deposited or otherwise formed on substrate 300 using any suitable techniques as will be apparent in light of this disclosure. For example, hardmask 310 may be blanket deposited or otherwise grown on substrate 300 using chemical vapor deposition (CVD), atomic layer deposition (ALD), physical vapor deposition (PVD), spin-on processing, and/or any other suitable process to form hardmask 310 on substrate 300. In some instances, the top surface of substrate 300 on which hardmask 310 is to be deposited may be treated (e.g., via chemical treatment, thermal treatment, etc.) prior to deposition of the hardmask 310 material. After being blanket formed on substrate 300, hardmask 310 may then be patterned using any suitable techniques, such as one or more lithography and etch processes, for example. Hardmask 310 may include any suitable material, such as oxide material, nitride material, and/or any other suitable dielectric/electrical insulator material, for example. Specific oxide and nitride materials may include silicon oxide, titanium oxide, hafnium oxide, aluminum oxide, silicon nitride, and titanium nitride, just to name a few examples. In some cases, the material of hardmask 310 may be selected based on the material of substrate 300, for example.

In embodiments, the substrate 300 may be: a bulk substrate including group IV semiconductor material (e.g., Si, Ge, SiGe), group III-V semiconductor material, and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). The use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

In some embodiments, substrate 300 may be doped with any suitable n-type and/or p-type dopant selected in light of the dopant used to dope replacement fins (as described herein). For instance, in the case, of a Si substrate, the Si may be p-type doped using a suitable acceptor (e.g., boron) or n-type doped using a suitable donor (e.g., phosphorous, arsenic), to provide some example cases. However, in some embodiments, substrate 300 may be undoped/intrinsic or relatively minimally doped (such as including a dopant concentration of less than 1E16 atoms per cubic cm), for example.

In some embodiments, substrate 300 may include a surface crystalline orientation described by a Miller index of (100), (110), or (111), or its equivalents, as will be apparent in light of this disclosure. Although substrate 300, in this example embodiment, is shown as having a thickness (dimension in the Y-axis direction) similar to other layers shown in subsequent structures for ease of illustration, in some instances, substrate 300 may be much thicker than the other layers, such as having a thickness in the range of 50 to 950 microns, for example, or any other suitable thickness as will be apparent in light of this disclosure.

In some embodiments, substrate 300 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Figure 3B:
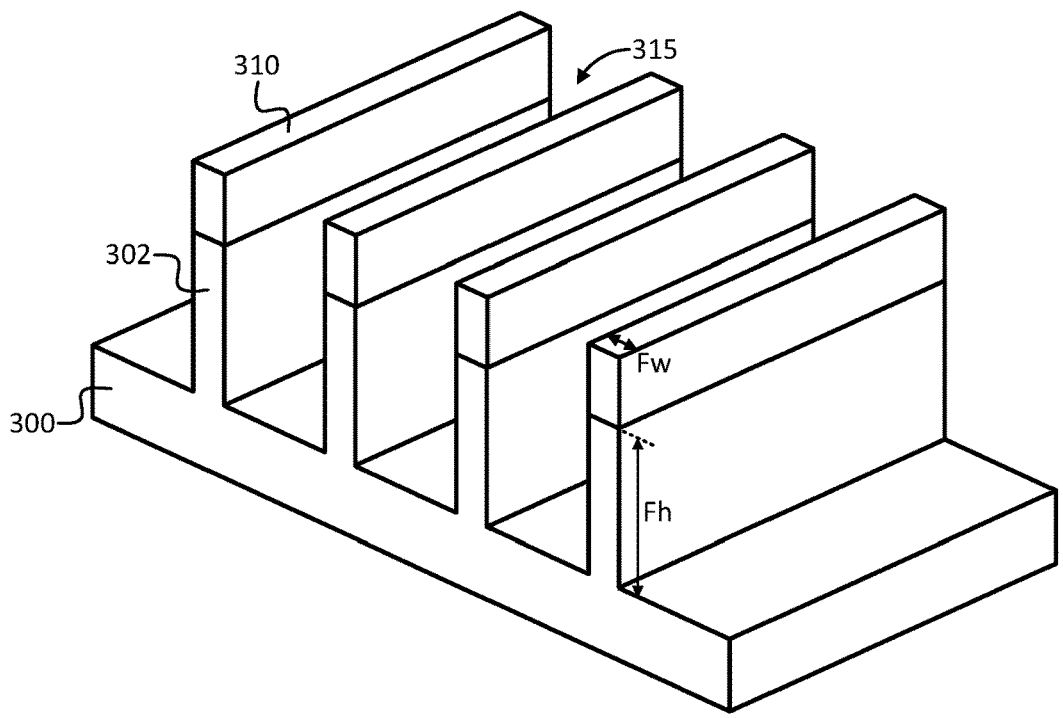

Method 100 of FIG. 1 continues with performing 104 shallow trench recess (STR) etch to form fins 302 from substrate 300, thereby forming the resulting example structure shown in FIG. 3B, in accordance with some embodiments. In some embodiments, the STR etch 104 used to form trenches 315 and fins 302 may include any suitable techniques, such as various masking processes and wet and/or dry etching processes, for example. In some cases, STR etch 104 may be performed in-situ/without air break, while in other cases, STR etch 104 may be performed ex-situ, for example. Trenches 315 may be formed with varying widths (dimension in the X-axis direction) and depths (dimension in the Y-axis direction) as can be understood based on this disclosure. For example, multiple hardmask patterning 102 and STR etching 104 processes may be performed to achieve varying depths in the trenches 315 between fins 302. Fins 302 may be formed to have varying widths Fw (dimension in the X-axis direction) and heights Fh (dimension in the Y-axis direction). For example, in a trench fill integration scheme, the fins may be formed to have particular height to width ratios. Note that although hardmask structures 310 are still present in the example structure of FIG. 3B, in some cases, that need not be the case, as they may have been consumed during the STR etch, for example.

In some embodiments, the fin widths Fw (labeled in FIG. 3B to show a dimension in the horizontal or X-axis direction) may be in the range of 2-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. In some embodiments, the fin heights Fh (labeled in FIG. 3B to show a dimension in the vertical or Y-axis direction) may be in the range of 4-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the fin heights Fh may be at least 25, 50, 75, 100, 125, 150, 175, 200, 300, 400, or 500, 600, 700, or 800 nm tall, or greater than any other suitable threshold height as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, 10, or 20 or greater than any other suitable threshold ratio, as will be apparent in light of this disclosure. Note that the trenches 315 and fins 302 are each shown as having essentially the same sizes and shapes in this example structure for ease of illustration; however, the present disclosure is not intended to be so limited. For example, in some embodiments, the fins 302 may be formed to have varying heights Fh, varying widths Fw, varying starting points (or varying starting heights), varying shapes, and/or any other suitable variations as will be apparent in light of this disclosure. Moreover, trenches 315 may be formed to have varying depths, varying widths, varying starting points (or varying starting depths), varying shapes, and/or any other suitable variations as will be apparent in light of this disclosure. Further note that although four fins 302 are shown in the example structure of FIG. 3B for ease of illustration, any number of fins may be formed, such as one, two, three, five, ten, hundreds, thousands, millions, billions, and so forth, as can be understood based on this disclosure.

Method 100 of FIG. 1 continues with depositing 106 shallow trench isolation (STI) material 320 and planarizing/polishing the structure to form the example resulting structure of FIG. 3C, in accordance with some embodiments. In some embodiments, deposition 106 of STI material 320 may include any suitable deposition techniques, such as those described herein (e.g., CVD, ALD, PVD), or any other suitable deposition process. In some embodiments, STI material 320 (which may be referred to as an STI layer) may include any suitable electrically insulating material, such as one or more dielectric, oxide (e.g., silicon dioxide), and/or nitride (e.g., silicon nitride) materials. In some embodiments, the material of STI layer 320 may be selected based on the material of substrate 300. For instance, in the case of a Si substrate, the STI material may be selected to be silicon dioxide or silicon nitride, to provide some examples. In some embodiments, the planarizing and/or polishing process(es) performed after forming STI material 320 may include any suitable techniques, such as chemical-mechanical planarization/polishing (CMP) processes, for example.

In embodiments where the fins are to be removed and replaced to form 110 replacement semiconductor material (e.g., to be used in the channel region of one or more transistor devices), the structure of FIG. 3C enables such processing. For example, continuing from the structure of FIG. 3C, fins 302 may be etched 108, and thus recessed or removed, using selective etch processing. That is, for example, for a given etchant, the semiconductor material of fins 302 is etched 108 selective to the insulator material of STI layer 320 to form fin-shaped trenches between STI material 320. A replacement semiconductor material can be deposited/grown (or more generally "formed") 110 (e.g., using any suitable techniques, such as CVD, metal-organic CVD (MOCVD), ALD, molecular beam epitaxy (MBE), PVD). For instance, FIG. 3C' is a magnified view of a portion of FIG. 3C illustrating alternative recess and replace processing to form 110 a replacement material fin, in accordance with some embodiments. In FIG. 3C', replacement fin 330 was formed 110, and the replacement fin 330 (and generally, any replacement fin formed) may include any suitable semiconductor material (e.g., group IV and/or III-V semiconductor material). For instance, replacement fins including SiGe or Ge may be formed 110 by etching 108 native Si fins during such processing and replacing them with the SiGe or Ge material, to provide some examples. In addition, replacement fin 330 may include any suitable n-type or p-type dopant that is selected so that, ultimately, a source region and a drain region have an oppositely charged carrier to that of a substrate, as described herein. In some embodiments, replacement material fins, such as replacement fin 330 of FIG. 3C' may be formed using alternative processing. For instance, in some embodiments, replacement material fins may be formed 110 by blanket-growing the replacement material on the substrate (e.g., using epitaxial deposition processing) and then patterning the replacement material into replacement material fins, to provide an example alternative. Such an example alternative process may also include forming STI material between the replacement material fins to form 110 a structure similar to that shown in FIG. 3C', for instance. Note that replacement fin 330 is illustrated with patterning/shading to merely assist with visually identifying that feature.

Note that only one fin is shown being replaced in the example embodiment of FIG. 3C'; however, the present disclosure is not intended to be so limited. In some embodiments, all of the native fins 302 may be replaced or only a subset may be replaced (e.g., such that some replacement fins are available for subsequent processing and some native fins 302 remain for subsequent processing). Further, in some embodiments, the recess and replace process may be performed as many times as desired to form as many subsets of replacement fins as desired by masking off the areas not to be processes for each replacement fin subset processing. In some such embodiments, a first subset of replacement fins may be formed for n-channel transistors (e.g., where the first replacement material is selected to increase electron mobility) and a second subset of replacement fins may be formed for p-channel transistors (e.g., where the second replacement material is selected to increase hole mobility). Further still, in some embodiments, a multilayer replacement fin may be formed to enable the subsequent formation of nanowires or nanoribbons in the channel region of one or more transistors, where some of the layers in the multilayer replacement fin are sacrificial and intended to be removed via selective etching (e.g., during replacement gate processing).

Note that the recess process used to form 110 replacement fin 330 included recessing native fin 302 (i.e., native to substrate 300) to a depth as shown, such that a portion of that native fin 302 remains (indicated in FIG. 3C' as fin portion 303 or a so-called fin-stub).

Continuing with the scenario depicted in FIG. 3C', generally, in a trench fill integration scheme, the fins may be formed to have particular height to width ratios (e.g., at least 2-5) such that when they are later removed or recessed, the resulting trenches formed allow the replacement material deposited to grow vertically from the native underlying substrate and be confined by non-crystalline/dielectric sidewalls. The material used to fill these trenches may be sufficiently lattice matched to the substrate (or to a buffer layer used between the substrate and replacement material) such that effectively no relaxation or threading misfit dislocation formation occurs (e.g., the misfit dislocations occur at levels below 1E5 dislocations per square cm). For instance, this lattice match condition is true for native Si fins and trench fill of SiGe replacement material having Ge concentration (by atomic percentage) of less than 45% and fin heights Fh of less than 50 nm, to provide an example. Alternatively, using the Si substrate (such that the native Si fins are recessed to form trenches), a replacement material trench fill of Ge, SiGe with Ge concentration of at least 80%, or GaAs can be performed such that the dislocations form right at the native/replacement material interface and again effectively no threading misfit dislocation formation occurs at the top surface of the replacement material fin.

Method 100 of FIG. 1 continues with recessing 112 the STI material 320 to cause at least a portion 304 of fins 302 to protrude from the STI plane, thereby forming the resulting example structure shown in FIG. 3D, in accordance with some embodiments. In some embodiments, recessing 112 may be performed using any suitable techniques, such as using one or more wet and/or dry etch processes that allow the STI material 320 to be selectively recessed relative to the material of fin 302, and/or any other suitable processing as will be apparent in light of this disclosure. As can be understood based on this disclosure, fin portions 304 may be used in the active channel region of one or more transistors, such that fin portions 304 (the portions of fins 302 above the top plane of STI layer 320 after recess 112 has been performed) may be referred to as active fin portions herein, for example.

As shown in FIG. 3D, the portions 304 of fins 302 exuding above the top plane of STI layer 320 have an active fin height indicated as Fah, which may be in the range of 4-800 nm (e.g., in the subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range, as will be apparent in light of this disclosure. In some embodiments, the active fin heights Fah may be at least 25, 50, 75, 100, 125, 150, 175, 200, 300, 400, 500, 600, 700, or 800 nm tall, or greater than any other suitable threshold height as will be apparent in light of this disclosure. The active fin height is referred to as such because at least one portion of that fin (along the Z-axis) may be used in the channel region of a least one transistor, where the fin portion 303 (which is between two regions of STI material 320) is desired to not be a part of the channel region that includes the location for the active channel. FIG. 3D' is a magnified view of a portion of FIG. 3D illustrating the replacement fin 330 from FIG. 3C' after the STI material has been recessed, in accordance with some embodiments.

Figure 3E:
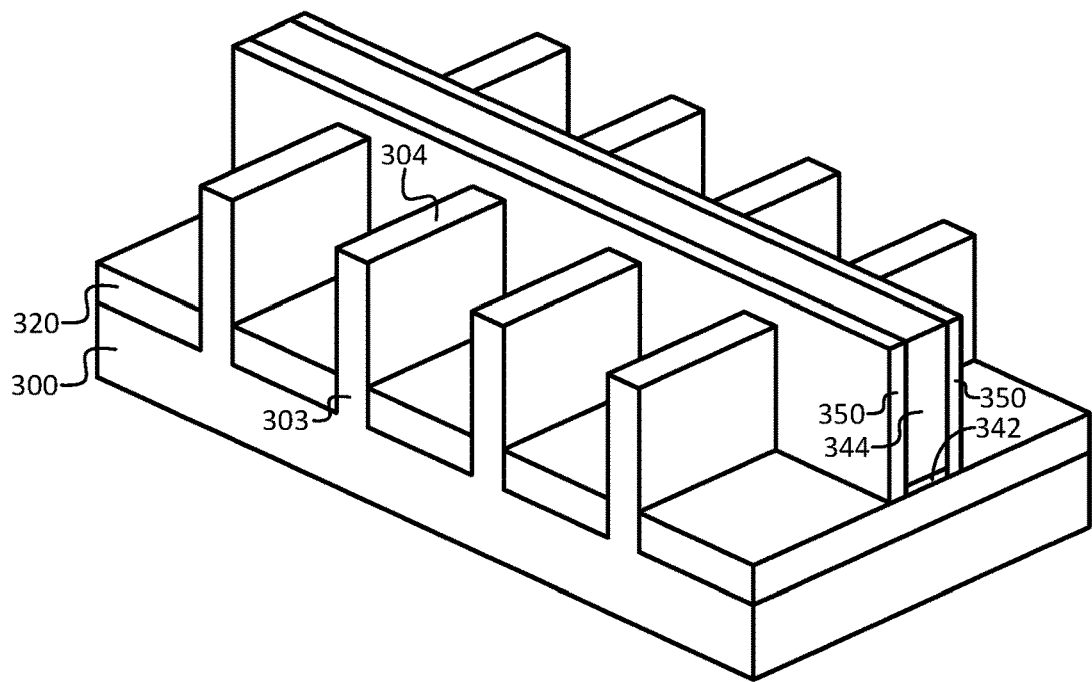
Figure 3F:
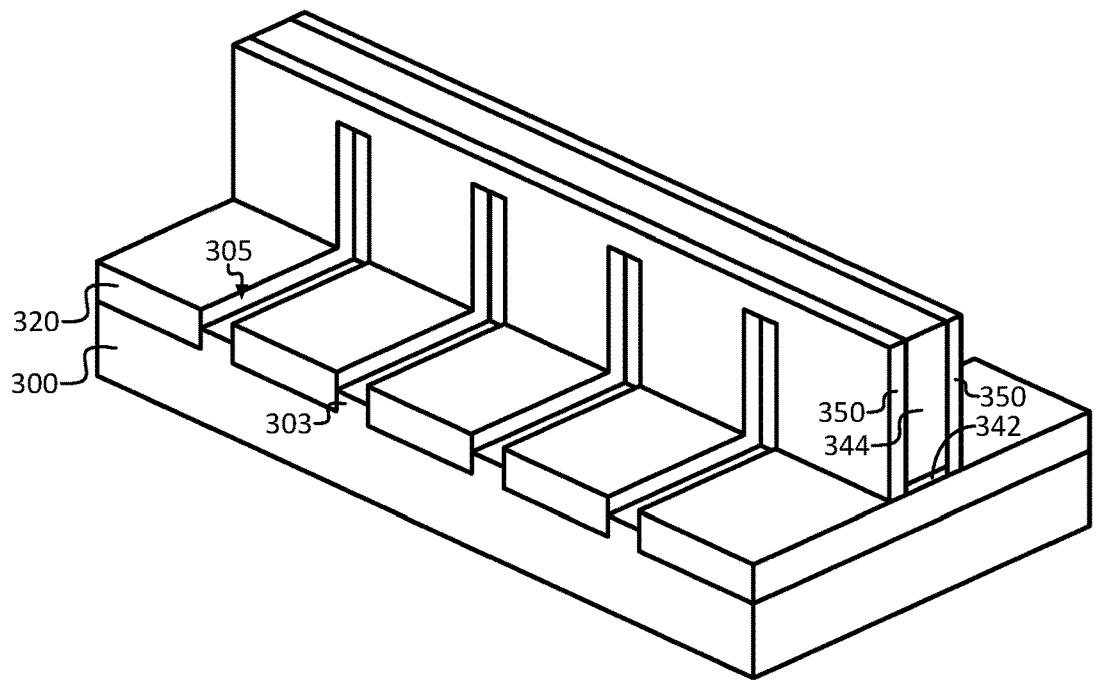

Method 100 of FIG. 1 continues with optionally forming 114 a dummy gate stack to form the example resulting structure of FIG. 3E, in accordance with some embodiments. Recall that method 100 is primarily described herein in the context of a gate last transistor fabrication process flow, where the processing includes forming a dummy gate stack, performing the S/D processing, and then forming the final gate stack after the S/D regions have been processed. However, in other embodiments, the techniques may be performed using a gate first process flow. In such an example case, process 114 (forming a dummy gate stack) would not be performed, and thus, process 114 may be optional in some embodiments (such as those employing the gate first process flow). This is reflected with the alternative location for performing 120 final gate stack processing, which is shown as the optional gate first flow 100' in FIG. 1, where performing 120 the final gate stack processing would instead occur at the location of box 114 in embodiments employing a gate first process flow, for example. However, the description of method 100 will continue using a gate last process flow, to allow for such a flow (which generally includes additional processing) to be adequately described.

Continuing with forming 114 a dummy gate stack, such a dummy gate stack (where employed) may include dummy gate dielectric 342 and dummy gate electrode 344, thereby forming the example resulting structure of FIG. 3E, in this example embodiment. In this example embodiment, dummy gate dielectric 342 (e.g., dummy oxide material) and dummy gate electrode 344 (e.g., dummy poly-silicon material) may be used for a replacement gate process. Note that side-wall spacers 350, referred to generally as gate spacers (or simply, spacers), on either side of the dummy gate stack were also formed, and such spacers 350 can be used to help determine the channel length and/or to help with replacement gate processes, for example. As can be understood based on this disclosure, the dummy gate stack (and spacers 350) can help define the channel region and source/drain (S/D) regions of each fin, where the channel region is below the dummy gate stack (as it will be located below the final gate stack), and the S/D regions are on either side of and adjacent to the channel region. Note that because the IC structures are being described in the context of forming finned transistors, the final gate stack will also be adjacent to either side of the fin, as the gate stack will reside along three walls of the finned channel regions, in embodiments employing a finned (e.g., FinFET) configuration.

Formation of the dummy gate stack may include depositing the dummy gate dielectric material 342 and dummy gate electrode material 344, patterning the dummy gate stack, depositing gate spacer material 350, and performing a spacer etch to form the structure shown in FIG. 3E, for example. Spacers 350 may include any suitable material, such as any suitable electrical insulator, dielectric, oxide (e.g., silicon oxide), and/or nitride (e.g., silicon nitride) material, as will be apparent in light of this disclosure. It will be appreciated that while spacers 350 are shown herein as comprising a single (vertically oriented or horizontally oriented) layer, this need not be the case. In some examples, the spacers 350 can include more than one layer whether to tailor the electrical properties (e.g., dielectric constant) of the spacers 350 or to tailor one or more physical dimensions. Note that in some embodiments, as previously described, the techniques described herein need not include forming a dummy gate stack, such that a final gate stack may be formed in the first instance. Regardless, the end structure will include the final gate stack described herein, as will be apparent in light of this disclosure. Also note that in some embodiments, a hardmask may be formed over the dummy gate stack (which may or may not also be formed over spacers 350) to protect the dummy gate stack during subsequent processing, such as during contact precursor deposition as will be described below, for example. The previous relevant description of hardmask 310 is equally applicable to such a hardmask feature, where employed.

Method 100 of FIG. 1 continues with performing 116 the source/drain (S/D) region processing to form the example resulting structure of FIG. 3G, in accordance with some embodiments. Performing 116 the processing includes, in this example embodiment, removing portions of fins 304 (or replacement fins 330, where employed) located in the S/D regions defined by the dummy gate stack (in this example embodiment) to form S/D trenches 305 as shown in the example resulting structure of FIG. 3F. In some embodiments, including the one shown in FIG. 3F, this can extend into the substrate 300. In some embodiments, removing the portions of fins 304 (or the portions of replacement fins 330, where employed) in the S/D regions may include any suitable techniques, such as one or more wet and/or dry etch processes, for example. Further, in some embodiments, replacing the S/D regions 304 (or 330) can be performing using any suitable techniques, such as one or more of the depositions processes described herein (e.g., CVD, MOCVD, ALD, PVD, MBE), and/or any other suitable processes as will be apparent in light of this disclosure. In some such embodiments, the replacement S/D regions 304 (or 330) may be formed using a selective deposition process, e.g., such that the S/D material only or primarily grows (or only grows in a monocrystalline structure) from the exposed semiconductor material sub-fin portions 303, as can be understood based on this disclosure. Note that the S/D regions 304 (or 330) are referred to herein as such for ease of description, but each S/D region 304 (or 330) may be either a source region or a drain region, such that the corresponding S/D region (on the other side of the channel region, and thus, on the other side of the dummy gate stack) is the other of the source region and drain region, thereby forming a source and drain region pair. For instance, as shown in the resulting structure of FIG. 3G, there are four different S/D region 334 pairs.

Although replacement fin 334 was formed using the techniques described herein that employ a fin-shaped trench, in other embodiments, replacement fin 334' may be formed using alternative techniques, such as by blanket depositing the replacement material and forming the replacement material into fins, followed by STI processing, as previously described. For example, FIG. 3G' depicts an example embodiment in which a replacement fin 334' (only two of which are shown for convenience) is epitaxially grown from the fin portion 303. In the example shown, in which the fin portion 303 is {111} silicon, the epitaxially grown single crystal replacement fin 334' includes {111} crystallographic facets on the top surfaces, where one of those top surfaces of the S/D regions is indicated as 332 in FIG. 3G' (the other surface is behind the surface indicated as 336, which cannot be seen in the view of FIG. 3G'). In other words, the upper-most surfaces (e.g., the surfaces farthest from substrate 300) include {111} faceting, in this example embodiment. In some embodiments, a {111} crystallographic faceted surface 336 of a given S/D region 334' may be represented by that surface including a non-orthogonal angle (illustrated in FIG. 3G' as angle D) of approximately 54.7 degrees (plus/minus 5 degrees) relative to the (001) plane, the main plane of substrate 300, the top plane of substrate 300, and/or the top plane of STI layer 320, for example.

In some embodiments, the S/D regions may have different shapes. For instance, FIG. 3G'' is an illustration of an alternative rounded S/D region 334'' that may be formed, in accordance with some embodiments. As shown, rounded S/D region 334'' includes a rounded and unfaceted top, and the rounded or curved S/D region 334'' also extends past the underlying sub-fin portion 303 in the X-axis direction. As can be understood based on this disclosure, S/D regions including any shape (such as the diamond shape of S/D regions 334' or the rounded shape of S/D region 334'') can benefit from conformal, crystalline S/D contacts as described herein.

Regardless of the shape of the replacement S/D region, in some embodiments, the S/D regions 334 may include any suitable semiconductor material as will be apparent in light of this disclosure, such as monocrystalline group IV semiconductor material. For instance, a given S/D region may include Ge-rich material, such as Ge or SiGe with at least 50% Ge concentration (by atomic percentage). Thus, in such embodiments where a given S/D region includes Ge-rich material, the Ge concentration may be in the range of 50-100% (or in any suitable subrange, such as in the subrange of 50-60, 50-70, 50-80, 50-90, 60-70, 60-80, 60-90, 60-100, 70-80, 70-90, 70-100, 80-90, 80-100, or 90-100%), or any other suitable value or range as will be apparent in light of this disclosure. The replacement S/D region may also include any one or more of In, Ga, As, Al, Si, Ge, Sn, among other elements.

In some embodiments, a given S/D region may include a Ge concentration (by atomic percentage) of at least 50, 55, 60, 65, 70, 75, 80, 85, 90, or 95%, for example. In some embodiments, S/D regions 334 may include semiconductor material that is or may not include n-type doped and/or p-type dopant. Where present, the dopant may be included in a concentration in the range of 1E17 to 5E22 atoms per cubic centimeter, for example. In some embodiments, a given S/D region may include grading (e.g., increasing and/or decreasing) of the concentration of one or more materials within the feature, such as the grading of a semiconductor material component concentration and/or the grading of the dopant concentration, for example. For instance, in some such embodiments, the dopant concentration included in a given S/D region may be graded such that it is lower near the corresponding channel region and higher near the {111} faceted surfaces, corresponding S/D contact, which may be achieved using any suitable processing, such as tuning the amount of dopant in the reactant flow (e.g., during an in-situ doping scheme). In some embodiments, a given S/D region may include a multilayer structure that includes at least two compositionally different material layers. For instance, in the case of a FFFET device, the source region may include a multilayer structure that includes a p-type doped region and n-type doped region, in accordance with some embodiments. In some embodiments, a given S/D region may be raised such that it extends higher than a corresponding channel region (e.g., in the vertical or Y-axis direction).

Note that the features of the S/D regions 334 are shown with patterning to merely assist with visual identification of the different features in the figures. Also note that the S/D regions 334 are all shown as including the same sizes/shapes in the example structures, for ease of illustration; however, the present disclosure is not intended to be so limited. The patterning and sizing of any of the features in the figures is not intended to limit the present disclosure in any manner.

Also note that S/D regions 334 are all shown as including the same material and sizes/shapes in the example structure of FIG. 3G, for ease of illustration; however, the present disclosure is not intended to be so limited. For example, in some embodiments, one of the S/D regions 334 in a corresponding S/D region pair (such as region 334 on one side of the dummy gate stack) may be processed separately than the other S/D region in that pair (on the opposite side of the dummy gate stack), such that a corresponding S/D pair may include different material, dopant type, dopant concentration, sizes, shapes, and/or any other suitable difference as can be understood based on this disclosure. For instance, in the case of a TFET device, one of the S/D regions may include n-type doped semiconductor material and the other of the S/D regions may include p-type doped semiconductor material, to provide an example case, such that the n-type S/D region may be processed separately from the p-type S/D region. The separate processing may be achieved using any suitable techniques, such as masking off S/D regions not to be processed to allow processing of other S/D regions, and then masking off the other S/D regions to allow processing of the originally masked off S/D regions, for example. In some embodiments, a given S/D region may include the same or a similar material composition (e.g., within 1% different) as the corresponding/adjacent channel region (such as both including the same Ge-rich material). However, in other embodiments, a given S/D region may include a different material composition (e.g., at least 1, 2, 3, 4, 5, or 10% different) relative to the corresponding/adjacent channel region, for example.

As indicated in FIG. 1, the crystalline S/D contacts may be formed 118 immediately following formation 116 of the S/D regions and prior to formation on an ILD layer encapsulating the S/D regions performed as part of final gate stack processing 120. This is indicated in FIG. 1 as alternative pre-ILD contact formation method 100''. The description of contact formation 118 is described in detail in the context of formation 122, which follows. It will be appreciated that the optional method 100'' may be employed convenient for formation of crystalline contacts that are coextensive with the top surface and opposing sidewalls of the S/D regions down to a bottom of the S/D regions proximate to STI 320. This extensive coverage of nearly all of the S/D region surfaces is because the top surface and opposing sidewalls of the S/D regions are not encapsulated by an ILD layer, thus enabling the contact precursors to deposit and react on them. An embodiment of semiconductor device fabricated according to alternative pre-ILD contact formation method 100'' is shown and described below in the context of FIG. 4D.

Figure 3H:
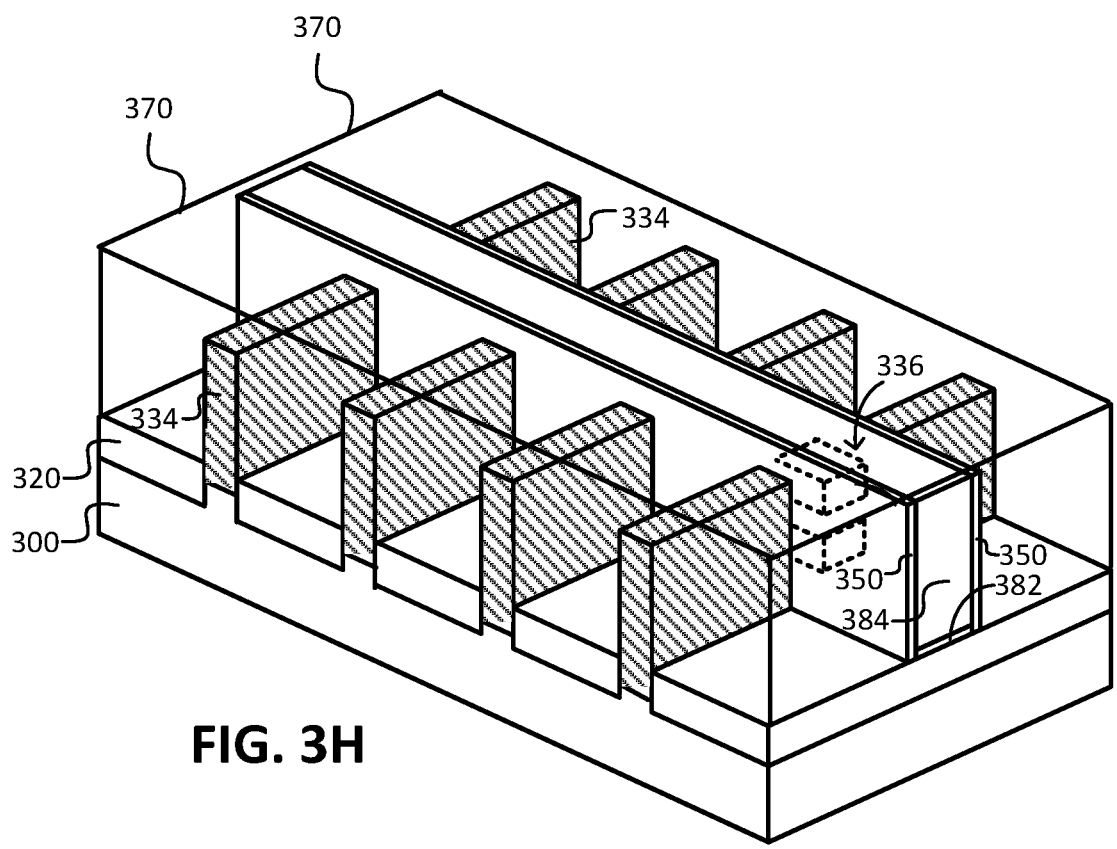

Method 100 of FIG. 1 continues with performing 120 the final gate stack processing to form the example resulting structure of FIG. 3H, in accordance with some embodiments. As shown, the processing in this example embodiment included depositing interlayer dielectric (ILD) layer 370 on the structure of FIG. 3G, followed by planarization and/or polishing (e.g., CMP) to reveal the dummy gate stack. Note that ILD layer 370 is shown as transparent in the example structure of FIG. 3H to allow for the underlying features to be seen; however, the present disclosure is not intended to be so limited. Also note that ILD layer 370 may include a multilayer structure, even though it is illustrated as a single layer. Further note that in some cases, ILD layer 370 and STI material 320 may not include a distinct interface as shown in FIG. 3H, particularly where, e.g., the ILD layer 370 and STI material 320 include the same dielectric material (e.g., where both include silicon dioxide). In some embodiments, the ILD layer 370 may include any desired electrical insulator, dielectric, oxide (e.g., silicon oxide), and/or nitride (e.g., silicon nitride) material, as will be apparent in light of this disclosure.

The final gate stack processing 120, in this example embodiment, continues with removing the dummy gate stack (including dummy gate 344 and dummy gate dielectric 342) to allow for the final gate stack to be formed. The final gate stack is shown in FIG. 3H. As shown in FIG. 3H, the formation of the final gate stack, which includes gate dielectric 382 and gate electrode 384, may be performed using a gate first flow (also called up-front hi-k gate). In such embodiments, the final gate stack processing may have been alternatively performed as indicated by optional gate first flow 100' in the method 100, instead of forming a dummy gate stack. However, in this example embodiment, the final gate stack is formed using a gate last flow (also called a replacement gate or replacement metal gate (RMG) process). Regardless of whether gate first or gate last processing is employed, the final gate stack can include gate dielectric 382 and gate electrode 384 as shown in FIG. 3H and described herein. It will be appreciated that the gate dielectric 382 may include one or more layers. For example, the gate dielectric 382 can include at least one of a native oxide forming on the channel region of the fin and at least one additional dielectric layer.

Note that when the dummy gate is removed, the channel region of fins 304 (or replacement material fins 330), which is the portion of the fins that were covered by the dummy gate stack (referred to in the cross-sections of FIGS. 4A and 4C as a "semiconductor body"), are exposed to allow for any desired processing of those channel regions. Such processing of a given channel region may include various different techniques, such as removing and replacing the channel region with replacement material, doping the channel region as desired, forming the channel region into one or more nanowires (or nanoribbons) for a gate-all-around (GAA) transistor configuration, forming the channel region into a beaded-fin configuration, cleaning/polishing the channel region, and/or any other suitable processing as will be apparent in light of this disclosure. For instance, a channel region corresponding to fins 334 in FIG. 3H is illustrated (which is the channel region of the left-most of the four original finned structures) and that finned channel region may be a portion of replacement material fin 330 and/or it may have been processed in any suitable manner (e.g., removed and replaced with other replacement material, doped in a desired manner, etc.). To provide another example, nanowire channel region 336 (which is the channel region of the right-most of the four original finned structures) may have been formed after the dummy gate was removed and the channel regions of the fins were exposed, by converting the finned structure at that location into the nanowires 336 shown using any suitable techniques, for example. For instance, the original finned channel region may have included a multilayer structure, where one or more of the layers were sacrificial and were selectively etched to remove those sacrificial layers and release the nanowires 336. As shown in FIG. 3H, nanowire channel region 336 includes 2 nanowires (or nanoribbons) in this example case. However, a nanowire (or nanoribbon or GAA) transistor formed using the techniques disclosed herein may include any number of nanowires (or nanoribbons) such as 1, 3, 4, 5, 6, 7, 8, 9, 10, or more, depending on the desired configuration. In some embodiments, a nanowire or nanoribbon may be considered fin-shaped where the gate stack wraps around each fin-shaped nanowire or nanoribbon in a GAA transistor configuration.

As can be understood based on this disclosure, the channel region is at least below the gate stack, in this example embodiment. For instance, in the case of a finned transistor configuration, the channel region may be below and between the gate stack, as the stack is formed on three sides of the semiconductor body, as is known in the art. However, if the transistor device were inverted and bonded to what will be the end substrate, then the channel region may be above the gate. Therefore, in general, the gate and channel relationship may include a proximate relationship (which may or may not include one or more intervening gate dielectric layers and/or other suitable layers), where the gate is near the channel region such that it can exert control over the channel region in some manner (e.g., in an electrical manner), in accordance with some embodiments. Further, in the case of a nanowire (or nanoribbon or GAA) transistor configuration, the gate stack may completely surround each nanowire/ nanoribbon in the channel region (or at least substantially surround each nanowire, such as surrounding at least 70, 80, or 90% of each nanowire). Further still, in the case of a planar transistor configuration, the gate stack may simply be above the channel region. In some embodiments, the channel region may include group IV semiconductor material (e.g., Si, SiGe, Ge), group III-V semiconductor material (e.g., GaAs, InGaAs, InAs), and/or any other suitable material as will be apparent in light of this disclosure. In some embodiments, the channel region may be doped (e.g., with any suitable n-type and/or p-type dopant) or intrinsic/undoped (or nominally undoped), depending on the particular configuration. For instance, in some such embodiments, the channel region may include Ge-rich material (e.g., Ge or SiGe with at least 50% Ge concentration) which may or may not be doped as desired (e.g., it may be doped with p-type dopant), to provide some examples.

Note that S/D regions 334 are adjacent to either side of a corresponding channel region, as can be seen in FIG. 3H, for example. More specifically, the S/D regions 334 are directly adjacent to a corresponding channel region, such that there are no intervening layers between either of the S/D regions and the channel region, in this example embodiment. However, the present disclosure is not intended to be so limited. Also note that the configuration/geometry of a transistor formed using the techniques described herein may primarily be described based on the shape of the respective channel region of that transistor. For instance, a nanowire (or nanoribbon or GAA) transistor may be referred to as such because it includes one or more nanowires (or nanoribbons) in the channel region of that transistor and because the gate stack (including the gate) wraps around (or at least substantially wraps around) each nanowire (or nanoribbon). However, the transistor type (e.g., MOSFET, TFET, FFFET, or other suitable type) may be described based on the doping and/or operating scheme of the source, channel, and drain regions, and thus those respective regions may be used to determine the type or classification of a given transistor, for example. For instance, MOSFET and TFET transistors may structurally be very similar (or the same), but they include different doping schemes (e.g., source-drain doping schemes for MOSFET of p-p or n-n versus p-n or n-p for TFET).

Continuing with performing 120 final gate stack processing, after the dummy gate has been removed and any desired channel region processing has been performed, the final gate stack can then be formed, in accordance with some embodiments. In this example embodiment, the final gate stack includes gate dielectric 382 and gate electrode 384, as shown in FIG. 3H. The gate dielectric 382 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric 382 to improve its quality when high-k dielectric material is used. The gate electrode 384 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate dielectric 382 and/or gate electrode 384 may include a multilayer structure of two or more material layers, for example. In some embodiments, gate dielectric 382 and/or gate electrode 384 may include grading (e.g., increasing and/or decreasing) the content/concentration of one or more materials in at least a portion of the feature(s). Additional layers may be present in the final gate stack, in some embodiments, such as one or more work function layers or other suitable layers, for example. Note that although gate dielectric 382 is only shown below gate electrode 384 in the example embodiment of FIG. 3H, in other embodiments, the gate dielectric 382 may also be present on one or both sides of gate electrode 384, such that the gate dielectric 382 may also be between gate electrode 384 and one or both of spacers 350, for example. Numerous different gate stack configurations will be apparent in light of this disclosure.

Method 100 of FIG. 1 continues with forming 122 S/D crystalline contacts on S/D regions. This process is described with reference to FIG. 2, which illustrates example component techniques of this formation 122.

Turning to FIG. 2, formation 122 of crystalline contacts on the S/D regions 334 begins by optionally exposing 128 at least a top portion of the S/D regions. The exposure 128 is indicated as an optional step because in some embodiments, as described above, the method corresponding to the formation 122 begins with S/D regions 330 (or 334) that are already unexposed. Thus, no removal of ILD (or a photolithographic mask) is needed prior to providing contact precursors to the crystalline surfaces of the S/D regions 330 (or 334). This configuration is indicated in FIG. 1 as the optional method 100," in which an ILD layer that encapsulates the S/D regions is formed after formation of the S/D contacts. As example of S/D regions that are not encapsulated by ILD and thus do not require exposure 128 of S/D regions is illustrated in FIG. 3K.

Figure 3I:
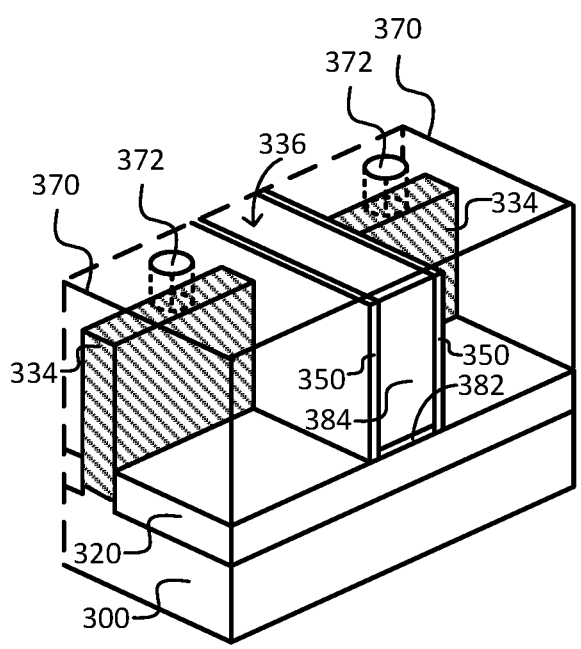
Figure 3J:
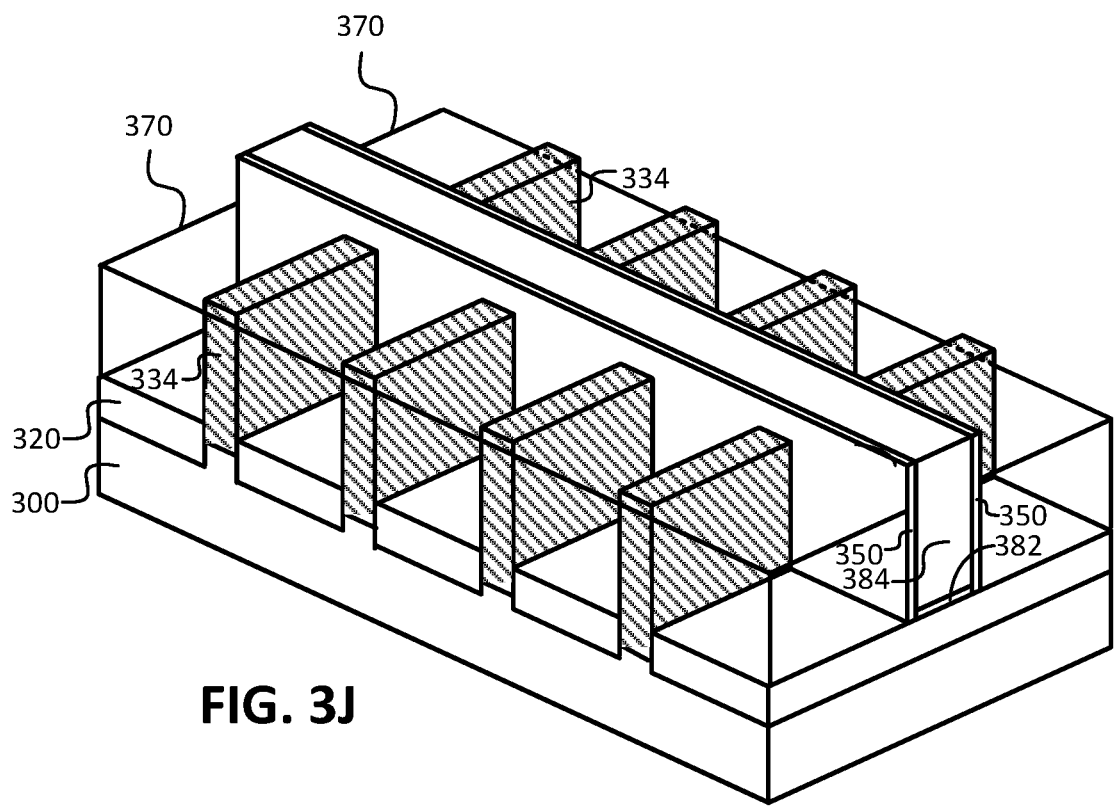
Figure 3K:
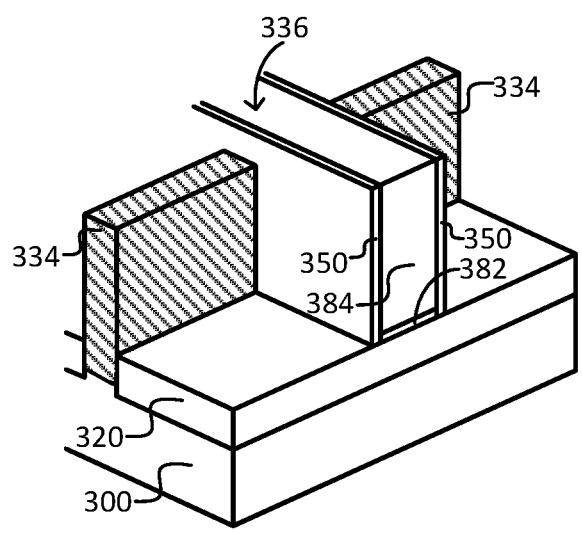

For embodiments in which the S/D regions are encapsulated by ILD formed during final gate stack processing 120, exposing 128 at least a portion of the S/D regions 334 can be accomplished by forming S/D contact trenches 372 through the ILD 370 and above the S/D regions 330 (or 334), as shown in FIG. 3I. In some such embodiments, the contact trenches 372 may be formed using any suitable techniques, such as performing one or more wet and/or dry etch processes to remove portions of ILD layer 370 as shown, and/or any other suitable processing as will be apparent in light of this disclosure. Such etch processing may be referred to as the S/D contact trench etch processing, or simply, contact trench etch processing. Further, in some such embodiments, the ILD may first be patterned such that areas that are not to be removed via the contact trench etch processing are masked off, for example. However, in other embodiments, the contact trench processing may remove more or less material. For example, in an embodiment, the contact trench 372 shown in FIG. 3I can be extended so as to be coextensive with a top surface of one or more of the S/D regions 330 (or 334). In still another embodiment shown in FIG. 3J, ILD 370 can be uniformly removed across a plurality of S/D regions to expose top surfaces of S/D regions 330 (or 334) as well as at least some of opposing sidewalls of the S/D regions 330 (or 334). In this way, an amount of S/D surface area can be selected for contact formation, thus selecting a contact resistance between a contact and its corresponding S/D region.

Regardless of how, or how much of, a S/D region 330 (or 334) is exposed, the method 122 continues by depositing 130 contact material precursors on the portions of the S/D regions exposed by the contact trench 372 or by a uniformly reduced level of ILD. Depositing 130 contact material precursors, which are vaporous or capable of being vaporized, can occur through any one or more of chemical vapor deposition (CVD), metalorganic chemical vapor deposition (MOCVD), atomic layer deposition (ALD), and molecular beam epitaxy (MBE), among others. Generally, at least two different types precursors will be deposited 130: a first type comprising one of silicon or germanium and a second type comprising a metal that can react with the first type to form a metal silicide or a metal germanide. Examples of the first type of precursor comprising one of silicon or germanium include, but are not limited to $SiH_4$, $Si_2H_6$, $Si_3H_8$, $Si_4H_{10}$, $SiH_2Cl_2$, $SiCl_4$, $SiHCl_3$, $GeH_4$, $Ge_2H_6$, $Ge_3H_8$, $Ge_4H_{10}$, $GeCl_4$. Examples of the second type precursor comprising a metal include, but are not limited to: TiCl4; organometallics such as $Ti(OMe)_4$, $Ti(OEt)_4$, $Ti(OPr)_4$, $Ti(OBu)_4$, and $Ti(N(CH_3)_2)_4$, $C_8H_{10}Ni$, $N(C_5H_5)_2Ni$, $Ni(C_5H_4C_2H_5)_2$, $Co(C_5H_5)_2$, $C_{14}H_{18}Co$. In the preceding precursors, "Me" refers to methyl, "Et" refers to ethyl, "Pr" refers to propyl, and "Bu" refers to butyl. While the metals in the examples of the second type of precursor presented above include titanium, nickel, and cobalt, other precursors that provide different metals are also possible within the scope of the present disclosure.

As indicated above, the precursors are selective to crystalline surfaces. In other words, when precursors (and more specifically, precursor vapors) are placed in the presence of crystalline surfaces and non-crystalline surfaces, the residence time of the precursors is longer on the crystalline surfaces compared to the non-crystalline surfaces. Because the precursors are disposed on crystalline surfaces for a longer period of time before becoming mobile again, there is more time, and therefore a greater likelihood, that precursor molecules will react with one another. The residence time of the precursors on crystalline surfaces (e.g., S/D regions) is so much greater than that for non-crystalline surfaces (e.g., ILD) that effectively S/D contact material forms predominantly on the exposed portions of the crystalline S/D regions. Furthermore, because the precursors are deposited 130 using the techniques indicated above, it is easier to control the rate and uniformity of deposition 130, particularly when compared to sputtering. Use of the precursors and one or more of the various deposition 130 techniques indicated above thus facilitates both conformal contact formation as well as dimensionally uniform contacts that vary in thickness less than 5 nm, less than 3 nm, or even less than 1 nm from one contact to another. In still other embodiments, the dimensionally uniform contacts vary in thickness less than 2 nm or less than 1 nm (sub-nanometer range).

Regardless when at least one precursor of each type of precursor is deposited 130 on a crystalline surface of a S/D region and heated to between 250° C. and 800° C., thus reacting 134 the precursors in situ with each other (and not with the material of the S/D regions) on the exposed portions of the S/D regions, conformal S/D contacts of at least one crystal are formed.

Various depictions of embodiments of source/drain regions and their corresponding contacts are illustrated in FIGS. 4A, 4B, 4C, and 4D. An embodiment of a crystalline S/D contact conformally disposed on a top surface of S/D regions is illustrated in cross-section (taken perpendicular to the gate) in FIG. 4A, and in perspective view in FIG. 4B. As shown in both of these figures, a semiconductor device 400 includes a substrate 404, a source region 408, a drain region 412, ILD 470, a semiconductor body 410 (the surfaces of which comprise the channel region) between the source region 408 and the drain region 412, a source contact 414A, and a drain contact 414B. The gate stack comprises spacers 450, a gate dielectric 482, and a gate electrode 484.

It will be appreciated that the source region 408 and the drain region 412 can correspond to any one or more of fins 304 (optionally doped in some embodiments), and the replacement fins described above including replacement fins 330, 334, 334', 334".

As shown, the ILD 470 has been formed so as to expose a top surface, but not side surfaces, of S/D regions 408 and 412. This configuration can be accomplished either by etching contact trenches to be coextensive with a top surfaces of an S/D region (e.g., a variation of the embodiment illustrated in FIG. 3I) or uniformly configure an ILD layer (either through controlled deposition or deposition followed by etching) so as to expose top surfaces of S/D regions (e.g., as illustrated in FIG. 3J). Regardless, S/D precursors selective to crystalline surfaces are provided to the S/D regions and reacted, thus forming S/D contacts 414A and 414B on the previously exposed crystalline top surfaces of S/D regions 408 and 412.

Figure 4A:
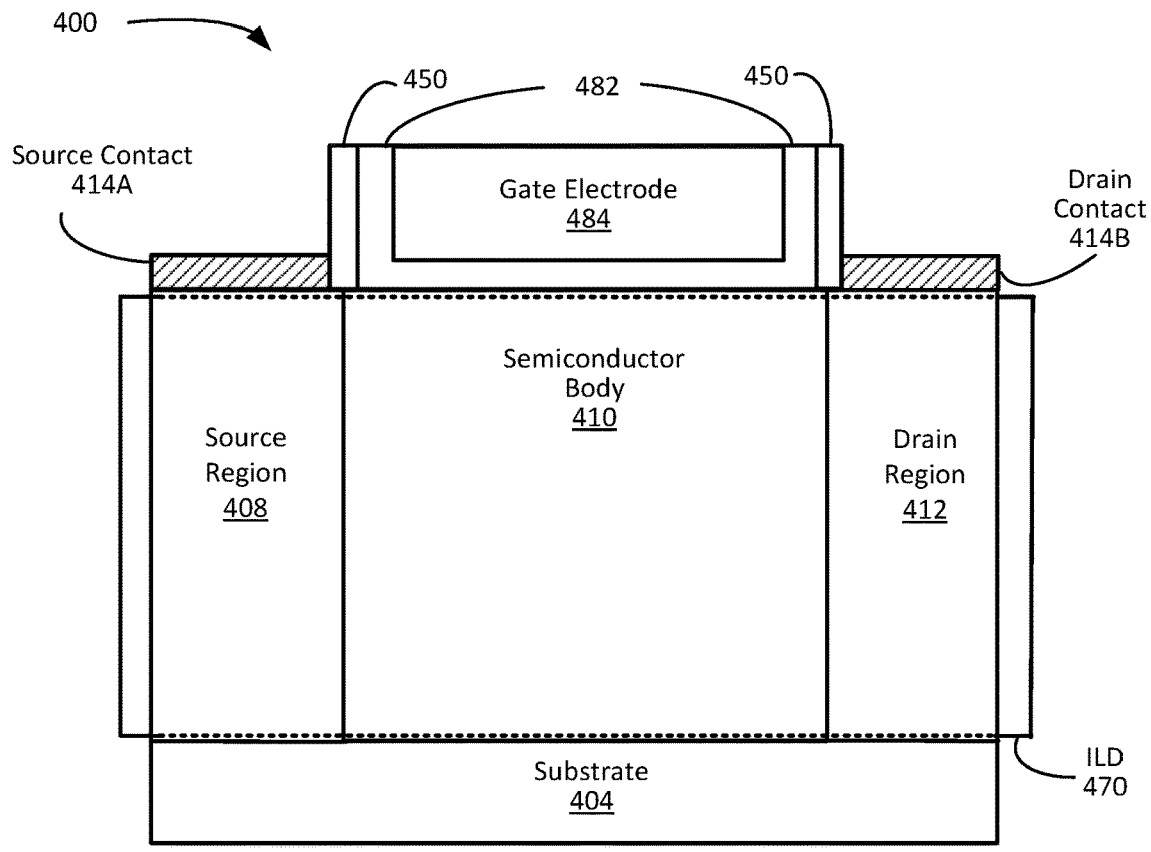
FIGS. 4A and 4B are a cross-sectional view and a perspective view, respectively, of an example FinFET semiconductor device prepared according to the example methods depicted in FIGS. 1 and 2, the source and drain region contacts of at least one crystal disposed on a top surface of the source and drain regions, the cross-section of FIG. 4A taken perpendicular to a gate, in accordance with an embodiment of the present disclosure.
Figure 4B:
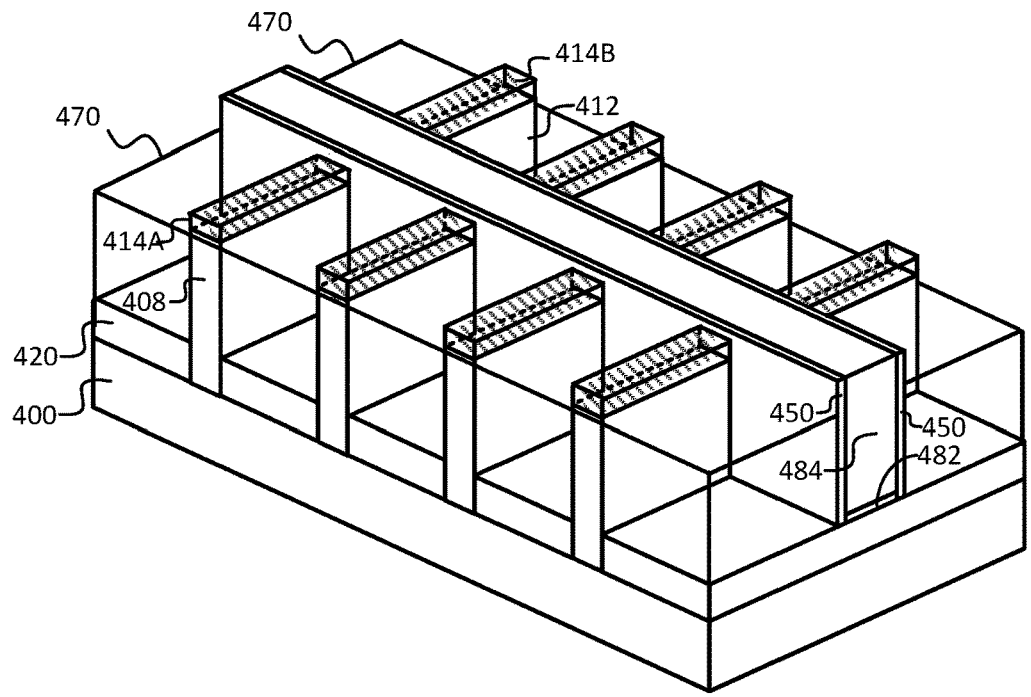
Figure 4C:
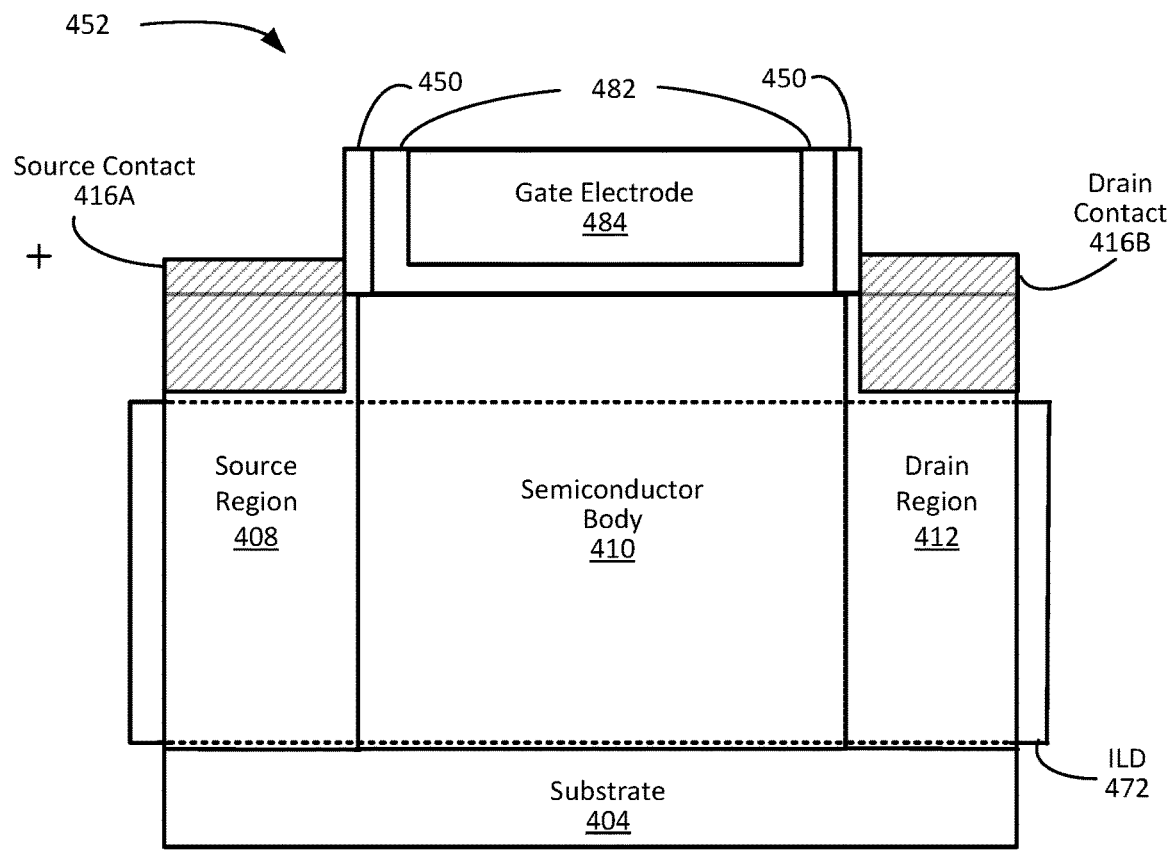
FIG. 4C is a cross-sectional view of an example FinFET semiconductor device prepared according to the example methods depicted in FIGS. 1 and 2, wherein the source and drain region contacts of at least one crystal are disposed on a top surface and on a portion of opposing sidewalls of the source and drain regions, in accordance with an embodiment of the present disclosure.

FIG. 4C illustrates an alternative embodiment in cross-section (taken perpendicular to the gate). The semiconductor device 452 shown in FIG. 4C has many of the same elements shown in FIG. 4A (which require no further description). However, unlike the semiconductor device 400 of FIG. 4A, the semiconductor device 452 has ILD 472 configured to expose a top surface and some of the opposing sidewalls of the source region 408 and drain region 412. As a result, the source contact 416A and drain contact 416B are coextensive not only with the exposed top surface of the corresponding source region 408 and drain region 412, but also on the portions of the sidewalls of the source region 408 and drain region 412 exposed by the ILD 472.

Figure 4D:
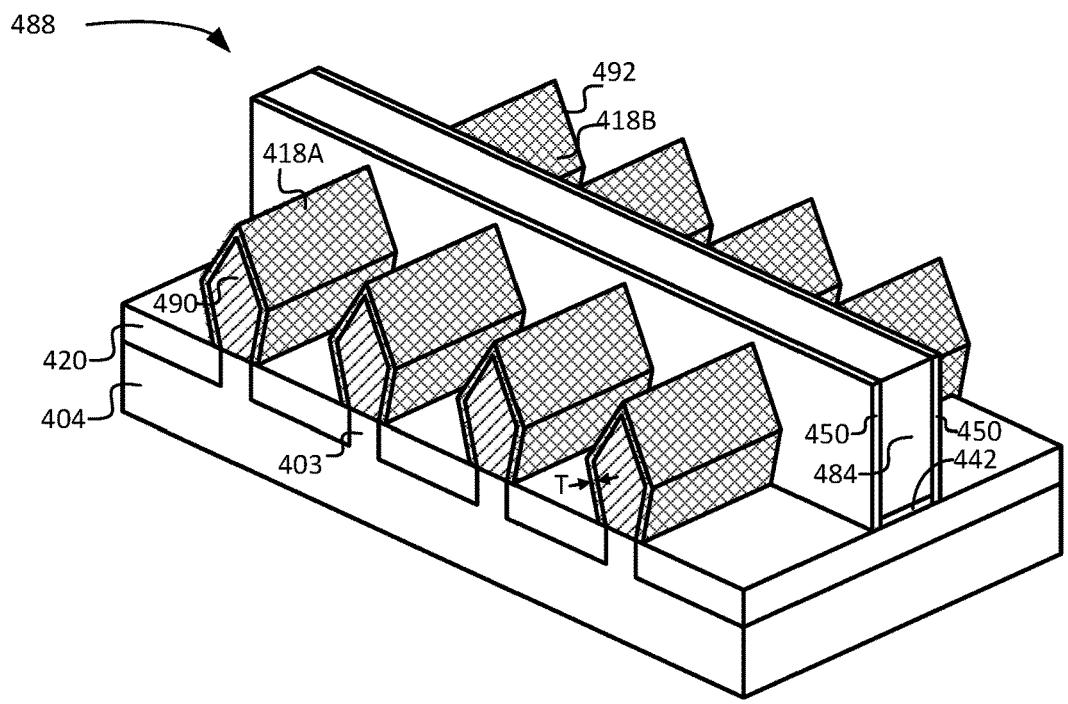
FIG. 4D is a perspective view of an example FinFET semiconductor device prepared according to the example methods depicted in FIGS. 1 and 2, the source and drain regions grown epitaxially from an underlying substrate and having conformal source and drain contacts of at least one crystal coextensive with the exposed surfaces of the source and drain regions, in accordance with an embodiment of the present disclosure.

FIG. 4D illustrates a semiconductor device 488 with two distinctions relative to the semiconductor devices depicted in FIGS. 4A to 4C. The first distinction is in the shape of the source regions 490 and drain regions 492. These replacement S/D regions 490, 492 are single crystals epitaxially grown from fin portion 403, as described above in the context of FIG. 3G'. As such, the replacement S/D regions 490, 492 includes {111} crystallographic facets, in this example embodiment, thus creating a diamond-like shape. It will be appreciated that any of the previously described embodiments can include these epitaxially shaped S/D regions without departing from the scope of the present disclosure.

The second distinction illustrated by the semiconductor device 488 in FIG. 4D is that the crystalline S/D contacts 418A and 418B are in contact with and coextensive with the entire surface of the corresponding S/D regions 490, 492. This is because, as described above, contact formation in this example occurs prior to formation of ILD (or, equivalently, after removal of ILD and prior to re-deposition of ILD). Furthermore, the conformal nature of the crystalline S/D contacts 418A, 418B is apparent upon inspection of FIG. 4D because the S/D contacts 418A, 418B have conformed to the diamond-like shape of the epitaxially grown S/D regions 490, 492. As indicated above, this conformal deposition is accomplished by providing the crystal-selective contact precursors using MBE, ALD, CVD, MOCVD, among other similar techniques. A thickness of the crystalline source contact 418A is indicated as thickness "T" which can be between 5 nm and 30 nm, as indicated above. As also indicated above, in some embodiments, the thickness of the contact 418A can have a difference in thickness relative to other contacts (e.g., 418B, among others) at most 5 nm or, in some other embodiments, at most 4 nm, or at most 3 nm, or at most 2 nm, or at most 1 nm. In some example cases, this relatively uniform thickness among the contacts as variously described herein is such that the biggest difference in thickness between any two contacts is in the sub-nanometer range, such as in the range of 0.01 nm to 0.90 nm, or 0.15 nm to 0.75 nm, or 0.20 nm to 0.60 nm, or any other sub-nanometer range.

In the example structures depicted in various figures, it can be understood that the crystalline S/D contacts of the present disclosure are electrically connected to corresponding S/D regions but need not be in physical contact with those regions. In some embodiments, an intervening crystalline layer may be between the S/D contacts and their respective S/D regions, for example. In some embodiments, additional layers may be present in the S/D contact regions, such as adhesion layers (e.g., titanium nitride) and/or liner or barrier layers (e.g., tantalum nitride), if so desired. However, in other embodiments, it will be appreciated that S/D contacts may also be in physical contact with the S/D regions.

Returning to FIG. 1, the method 100 continues with completing 126 integrated circuit (IC) processing as desired, in accordance with some embodiments. Such additional processing to complete the IC may include back-end or back-end-of-line (BEOL) processing to form one or more metallization layers and/or to interconnect the transistor devices formed during front-end or front-end-of-line (FEOL) processing, for example. Any other suitable processing may be performed, as will be apparent in light of this disclosure. Note that the processes of the methods 100 and 200 are shown in a particular order for ease of description. However, the various elements of the methods 100 and 200 may be performed in a different order or may not be performed at all. For example, box 114 is an optional process that need not be performed in embodiments employing a gate first process flow, for example. Recall that the techniques may be used to form a multitude of different transistor types and configurations. Although the techniques are primarily depicted and described herein in the context of forming crystalline contacts for both of the S/D regions of a given transistor, the present disclosure is not intended to be so limited, as the techniques may be used to benefit only one S/D region of a given transistor (and thus, only one side of a given channel region), and not the other, in some embodiments. Numerous variations and configurations will be apparent in light of the present disclosure.

Figure 4E:
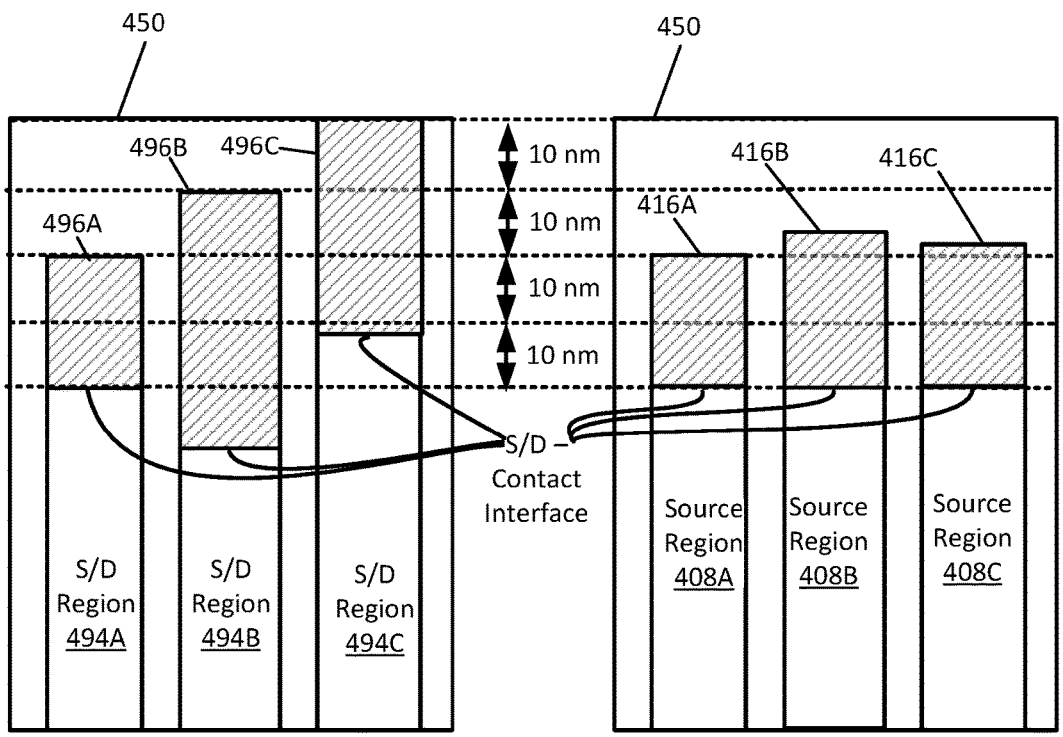
FIGS. 4E and 4E' are cross-sectional views of S/D regions taken parallel to a gate with contacts prepared by elemental metal deposition and by precursor deposition, respectively, and illustrating the differing variability in contact thickness.

FIGS. 4E, 4E', 4F, and 4F' compare various aspects of contacts formed according to elemental metal deposition versus corresponding aspects of contacts formed according to some embodiments of the present disclosure. For example FIGS. 4E and 4E' illustrate the relative variability in contact thickness for contacts prepared according to an elemental metal blanket deposition (FIG. 4E) and for contacts prepared using some embodiments of the present disclosure (FIG. 4E'). As shown in FIG. 4E, contacts 496A, 496B, and 496C formed by blanket elemental metal deposition and high temperature thermal processing on corresponding S/D regions 494A, 494B, and 494C have thicknesses of at least 20 nm. Also apparent upon inspection is that the variability of thickness (that is, the difference between thicknesses) of the various S/D regions 494A, 494B, and 494C can be greater than 20 nm. For example, the contact 496A has a thickness of approximately 20 nm whereas the contact 496B has a thickness of approximately 40 nm.

Figure 4F:
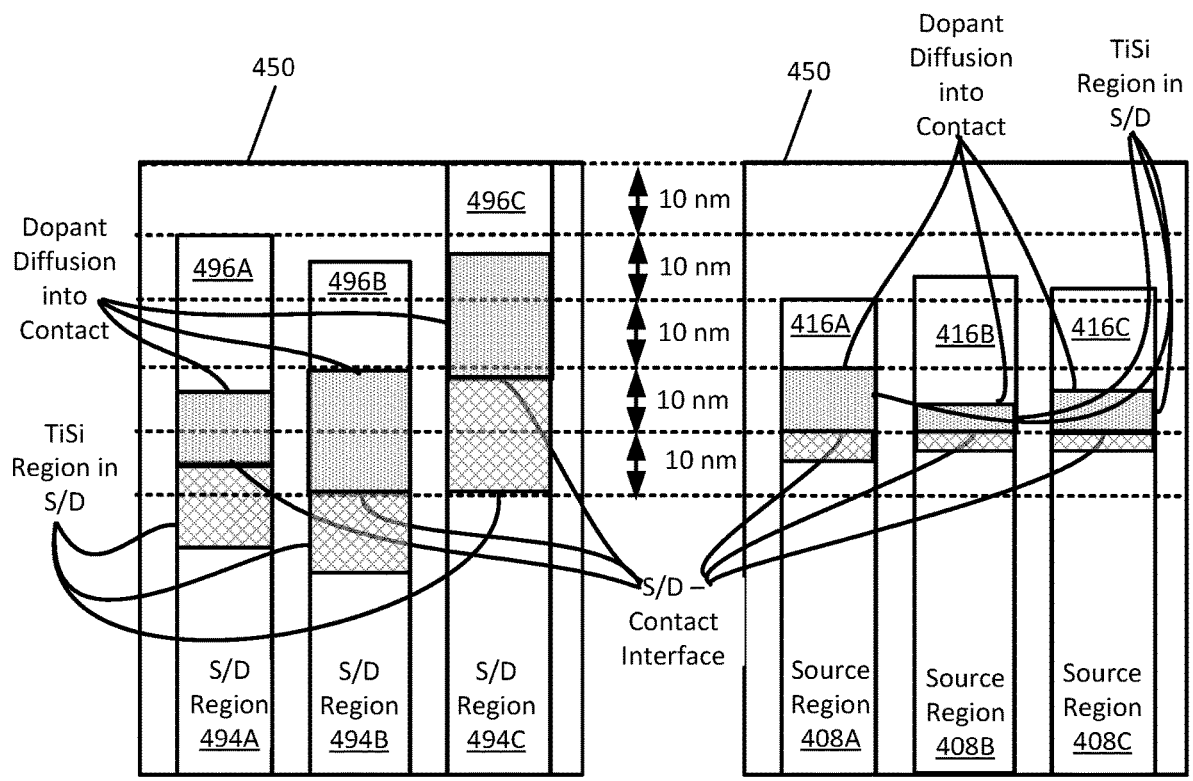
FIGS. 4F and 4F' are cross-sectional views of S/D regions taken parallel to a gate with contacts prepared by elemental metal deposition and by precursor deposition, respectively, and illustrating a differing extent of dopant diffusion from the S/D region into the contacts.

This is in contrast to the contacts 416A, 416B, and 416C formed on source regions 408A, 408B, and 408C according to some embodiments of the present disclosure. As is shown, the contacts 416A, 416B, and 416C vary in thicknesses relative to one another less than 10 nm (e.g., between contact 416A and 416B) and even less than 3 nm (e.g., between contact 416A and 416C). FIGS. 4F and 4F' illustrate two types of differences between contacts formed according to elemental metal deposition versus corresponding aspects of contacts formed according to some embodiments of the present disclosure. These two differences illustrated are the (1) distance that S/D dopant diffuses into the contact and (2) the distance that the elemental metal used to form the contact material (titanium in the example shown) diffuses into the S/D region rather than reacting to form the conductive silicide (or germanide) of the contact.

As shown in FIG. 4F, relative to the S/D contact interface, TiSi can extend into the S/D regions 494A, 494B, 494C more than 10 nm when contacts are formed by sputtering of elemental metal on S/D regions 494 and reacted with the S/D region material by high temperature thermal processing. During this high temperature processing (e.g., 800° C. or higher), dopant in the S/D can diffuse into the contacts 496A, 496B, and 496C by more than 10 nm (e.g., 20 nm beyond the S/D contact interface in the case of the contact 496B). These features illustrated in FIG. 4F are in contrast to corresponding features illustrated in FIG. 4F' for contacts prepared according to some embodiments of the present disclosure. As shown, a TiSi region extends less than 10 nm from the S/D-contact interface into the source region 408A, and even less than 5 nm in the cases of source regions 408B and 408C. The dopant from the source regions 408A, 408B, and 408C diffuse 10 nm or less from the S/D-contact interface into the contacts 416A, 416B, and 416C.

In part, reduced TiSi region and reduced dopant diffusion in some embodiments of the present disclosure can product a contact resistance between the source regions 408A, 408B, 408C (and/or corresponding drain regions, not shown) and corresponding contacts 416A, 416B, 416C that is less than $2 \times 10^{-9}$ Ohms-cm. Embodiments shown in FIG. 4F prepared according to sputtered elemental metal will generally have a contact resistance that is greater than $2 \times 10^{-9}$ Ohms-cm.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; atom probe tomography (APT); or high resolution physical or chemical analysis, to name a few suitable example analytical tools. In particular, in some embodiments, such tools may be used to detect conformal S/D contacts comprising at least one crystal (or crystalline region) having a thickness variability across a substrate of no more than 5 nm, no more than 3 nm, no more than 2 nm, or no more than 1 nm (e.g., 0.9 nm or less) in thickness variation. In other examples, such tools can identify adjacent conformal contacts that have grown together during deposition, thus obscuring a negative feature (i.e., a trench) from deposition of a subsequent layer. In still other examples, these tools can be used to detect presence of TiSi extending more than 10 nm into an S/D region and/or the presence of a S/D dopant (e.g., P or B, or any other impurity intending to provide a doping function) extending more than 10 nm into a contact on a S/D region.

Example System

Figure 5:
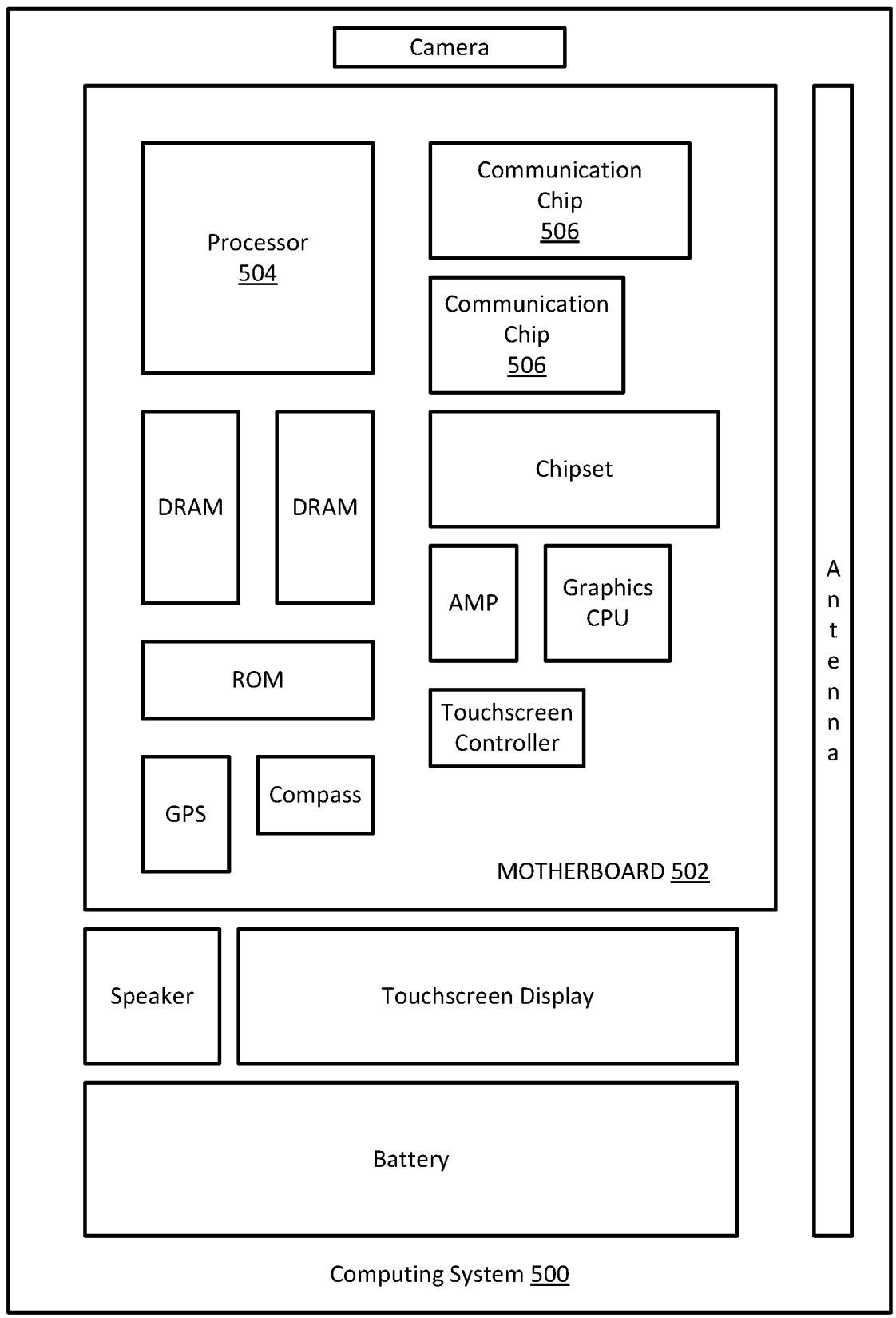
FIG. 5 illustrates a computing system implemented with integrated circuit structures and/or transistor devices formed using the techniques disclosed herein, in accordance with some embodiments of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board, whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., to include one or more conformal S/D contacts comprising at least one crystal, as variously provided herein). In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others. In some embodiments, communication chip 506 may include one or more transistor structures having one or more conformal S/D contacts comprising at least one crystal as variously described herein.

The processor 504 of the computing system 500 includes an integrated circuit die packaged within the processor 504. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit device comprising: a semiconductor body comprising a top surface and opposing sidewalls; a gate structure on the top surface and opposing sidewalls of the semiconductor body, the gate structure including a gate electrode and a gate dielectric between the gate electrode and the semiconductor body; a semiconductor source region and a semiconductor drain region; a source contact on at least a portion of the source region, the source contact comprising at least one crystal; and a drain contact on at least a portion of the drain region, the drain contact comprising at least one crystal, wherein a variation in thickness between the source contact and the drain contact is at most 5 nm.

Example 2 includes the subject matter of Example 1, wherein the source contact and the drain contact are both at most 20 nm thick.

Example 3 includes the subject matter of Examples 1 or 2, wherein the variation in thickness is at most 3 nm. In further example embodiments, the variation in thickness is at most 2 nm, or at most 1 nm (including the sub-nanometer range of 0.0 to 0.9 nm).

Example 4 includes the subject matter of any of the preceding Examples, wherein a pitch between adjacent source regions and drain regions is 100 nm or less.

Example 5 includes the subject matter of any of the preceding Examples, wherein a height to width aspect ratio of the source regions and the drain regions is at least 10.

Example 6 includes the subject matter of any of the preceding Examples, wherein the source contact is on a top surface and at least a portion of sidewalls of the source region.

Example 7 includes the subject matter of Example 6, wherein the source contact is on the sidewalls from the top surface of the source region to a bottom surface of the source region.

Example 8 includes the subject matter of any of the preceding Examples, wherein the drain contact is on a top surface and at least a portion of sidewalls of the drain region.

Example 9 includes the subject matter of Example 8, wherein the drain contact is on the sidewalls from the top surface of the drain region to a bottom surface of the drain region.

Example 10 includes the subject matter of any of the preceding Examples, wherein at least one of the source region and the drain region comprises crystallographic facets of a monocrystalline material used for the source region and the drain region; and wherein one or more of the source contact and drain contact is on corresponding crystallographic facets.

Example 11 includes the subject matter of Example 10, wherein the crystallographic facets of the monocrystalline material are non-orthogonal.

Example 12 includes the subject matter of any of the preceding Examples, wherein the source contact and the drain contact comprise silicon and titanium.

Example 13 includes the subject matter of any of Examples 1 through 11, wherein the source contact and the drain contact comprise germanium and nickel.

Example 14 includes the subject matter of any of the preceding Examples, wherein the semiconductor body comprises silicon.

Example 15 includes the subject matter of any of the preceding Examples, wherein the semiconductor body comprises silicon and germanium.

Example 16 includes the subject matter of any of Examples 1 through 13, wherein the semiconductor body comprises a semiconductor material.

Example 17 includes the subject matter of any of the preceding examples, wherein at least one of a source region and a source contact and a drain region and a drain contact have a contact resistance of less than $8 \times 10^{-9}$ Ohm-cm.

Example 18 includes the subject matter of any of the preceding examples, wherein the source region comprises a source dopant and the drain region comprises a drain dopant, the source dopant and the drain dopant being present in corresponding source contact and drain contact within less than 15 nm of an interface between the source region and the corresponding source contact and the drain region and the corresponding drain contact.

Example 19 is a computing device comprising the integrated circuit device of any of the preceding Examples.

Example 20 is a method for forming an integrated circuit device comprising: forming a semiconductor body comprising a first top surface and opposing sidewalls; forming a gate structure on the top surface and the opposing sidewalls of the semiconductor body, the gate structure including a gate electrode and a gate dielectric between the gate electrode and the semiconductor body; forming a semiconductor source region and a semiconductor drain region; forming a source contact on at least a portion of the source region, the source contact comprising at least one crystal; and forming a drain contact on at least a portion of the drain region, the drain contact comprising at least one crystal.

Example 21 includes the subject matter of Example 20, wherein forming the source contact and forming the drain contact comprise: exposing at least the portions of the top surface of the source region and the top surface of the drain region, respectively; providing precursors to the exposed top portions of the source region and the drain region; and reacting the precursors with each other on the exposed portions of the source region and the drain region to form the corresponding contacts.

Example 22 includes the subject matter of Example 21, wherein providing the precursors comprises using chemical vapor deposition.

Example 23 includes the subject matter of any of Examples 21 or 22, wherein providing the precursors comprises using atomic layer deposition.

Example 24 includes the subject matter of any of Examples 21 through 23, wherein providing the precursors comprises using molecular beam epitaxy.

Example 25 includes the subject matter of any of Examples 21 through 24, wherein the precursors provided to the portions of the source region and the drain region comprise: a first precursor comprising at least one of silicon and germanium; and a second precursor comprising at least one of titanium, nickel, and cobalt.

Example 26 includes the subject matter of Example 25, wherein: the first precursor further comprises at least one of hydrogen and chlorine; and the second precursor further comprises at least one of oxygen, nitrogen, and carbon; and at least one of a methyl group, an ethyl group, a propyl group, and a butyl group.

What is claimed is:

1. An integrated circuit device comprising:
a body comprising a top surface and opposing sidewalls, the body comprising semiconductor material;
a gate structure on the top surface and opposing sidewalls of the body, the gate structure including a gate electrode, and a gate dielectric between the gate electrode and the body;
a source region and a drain region;
a source contact on at least a portion of the source region, the source contact comprising at least one crystal comprising a metal; and
a drain contact on at least a portion of the drain region, the drain contact comprising at least one crystal comprising a metal, wherein a variation in thickness between the source contact and the drain contact is at most 5 nm.

2. The integrated circuit device of claim 1, wherein the source contact and the drain contact are both at most 20 nm thick and the variation in thickness is at most 3 nm.

3. The integrated circuit device of claim 1, wherein a pitch between the source region and an adjacent source region of an adjacent device is 100 nm or less and wherein a height to width aspect ratio of the source region and the drain region is at least 10.

4. The integrated circuit device of claim 1, wherein at least one of the drain contact and the source contact is on a top surface and at least a portion of sidewalls of the corresponding one of drain region and the source region.

5. The integrated circuit device of claim 4, wherein at least one of the drain contact and the source contact is on the sidewalls from the top surface to a bottom surface of the corresponding one of the drain region and the source region.

6. The integrated circuit device of claim 1, wherein:
at least one of the source region and the drain region comprises crystallographic facets of a monocrystalline material used for the source region and the drain region; and
wherein one or more of the source contact and drain contact is on corresponding crystallographic facets, and wherein the crystallographic facets of the monocrystalline material are non-orthogonal.

7. The integrated circuit device of claim 1, wherein the source contact and the drain contact comprise silicon and titanium.

8. The integrated circuit device of claim 1, wherein the source contact and the drain contact comprise germanium and nickel.

9. The integrated circuit device of claim 1, wherein the body comprises silicon.

10. The integrated circuit device of claim 1, wherein the body comprises silicon and germanium.

11. The integrated circuit device of claim 1, wherein the body comprises a III-V semiconductor material.

12. The integrated circuit device of claim 1, wherein at least one of a source region and a source contact and a drain region and a drain contact have a contact resistance of less than $2\times10^{-9}$ Ohm-cm.

13. The integrated circuit device of claim 1, wherein the source region comprises a source dopant and the drain region comprises a drain dopant, the source dopant and the drain dopant being present in corresponding source contact and drain contact within less than 10 nm of an interface between the source region and the corresponding source contact and the drain region and the corresponding drain contact.

14. A computing device comprising the integrated circuit device of claim 1.

15. An integrated circuit device comprising:
a body comprising semiconductor material;
a gate stack at least above the body;
a source region and a drain region; a source contact on at least a portion of the source region, the source contact comprising at least one crystal comprising a metal; and
a drain contact on at least a portion of the drain region, the drain contact comprising at least one crystal comprising a metal, wherein at least one of the source region and the drain region comprises crystallographic facets of a monocrystalline material, and the crystallographic facets are non-orthogonal; and
wherein one or both of the source contact and drain contact is on the corresponding crystallographic facets.

16. The integrated circuit device of claim 15, wherein the source contact and the drain contact are both at most 20 nm thick in the lateral direction and a corresponding maximum thickness of each of the source contact and the drain contact is at most 3 nm greater than a corresponding minimum thickness of each of the source contact and the drain contact.

17. The integrated circuit device of claim 15, wherein a distance between the source region and an adjacent source region of an adjacent device is 100 nm or less, and wherein a height to width aspect ratio of each of the source region and the drain region is at least 10.

18. A method for forming an integrated circuit device comprising:

forming a body comprising a first top surface and opposing sidewalls, the body including semiconductor material;

forming a gate structure on the top surface and the opposing sidewalls of the body, the gate structure including a gate electrode and a gate dielectric between the gate electrode and the body;

forming a source region and a drain region;

forming a source contact on at least a portion of the source region, the source contact comprising at least one crystal comprising a metal; and forming a drain contact on at least a portion of the drain region, the drain contact comprising at least one crystal comprising a metal.

19. The method of claim 18, wherein forming the source contact and forming the drain contact comprise:

exposing at least the portions of the top surface of the source region and the top surface of the drain region, respectively;

providing precursors to the exposed top portions of the source region and the drain region; and reacting the precursors with each other on the exposed portions of the source region and the drain region to form the corresponding contacts.

20. The method of claim 18, wherein the precursors provided to the portions of the source region and the drain region comprise:

a first precursor comprising at least one of silicon and germanium; and a second precursor comprising at least one of titanium, nickel, and cobalt.

* * * * *